(12) United States Patent
Chang et al.

(10) Patent No.: US 10,886,153 B2
(45) Date of Patent: Jan. 5, 2021

(54) DISPLAY INCLUDING AN LED ELEMENT HAVING A PRESSURE SENSITIVE ADHESIVE (PSA) FOR MICRO PICK AND BOND ASSEMBLY OF THE DISPLAY

(71) Applicant: Intel Corporation, Santa Clara, CA (US)

(72) Inventors: Peter L. Chang, Portland, OR (US); Chytra Pawashe, Portland, OR (US); Michael C. Mayberry, Beaverton, OR (US); Jia-Hung Tseng, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/224,550

(22) Filed: Dec. 18, 2018

(65) Prior Publication Data

US 2019/0148188 A1 May 16, 2019

Related U.S. Application Data

(62) Division of application No. 15/512,342, filed as application No. PCT/US2014/061053 on Oct. 17, 2014, now Pat. No. 10,242,892.

(51) Int. Cl.
*H01L 21/67* (2006.01)
*H01L 23/00* (2006.01)
(Continued)

(52) U.S. Cl.
CPC .... *H01L 21/67144* (2013.01); *H01L 21/6833* (2013.01); *H01L 24/00* (2013.01);
(Continued)

(58) Field of Classification Search
CPC .................................................. H01L 21/67144
See application file for complete search history.

(56) References Cited

U.S. PATENT DOCUMENTS 4,761,335 A 8/1988 Aurichio et al.
5,441,809 A * 8/1995 Akhter ...................... H05F 3/00
428/354
(Continued)

FOREIGN PATENT DOCUMENTS

EP 2717333 4/2014
JP 2003079304 3/2003
(Continued)

OTHER PUBLICATIONS

Hans-Heinrich Moretto, Manfred Schulze, Gebhard Wagner (2012) "Silicones" in Ullmann's Encyclopedia of Industrial Chemistry, Wiley-VCH, Weinheim (Year: 2012).*
(Continued)

*Primary Examiner* — Robert T Huber
*Assistant Examiner* — Laura M Dykes
(74) *Attorney, Agent, or Firm* — Green, Howard & Mughal LLP.

(57) ABSTRACT

Micro pick-and-bond heads, assembly methods, and device assemblies. In, embodiments, micro pick-and-bond heads transfer micro device elements, such as (micro) LEDs, en masse from a source substrate to a target substrate, such as a LED display substrate. Anchor and release structures on the source substrate enable device elements to be separated from a source substrate, while pressure sensitive adhesive (PSA) enables device elements to be temporarily affixed to pedestals of a micro pick-and bond head. Once the device elements are permanently affixed to a target substrate, the PSA interface may be defeated through peeling and/or thermal decomposition of an interface layer.

17 Claims, 18 Drawing Sheets

(51) Int. Cl.
*H01L 33/00* (2010.01)
*H01L 21/683* (2006.01)
*H01L 25/075* (2006.01)
*H01L 33/36* (2010.01)
*H01L 33/44* (2010.01)
*H01L 33/62* (2010.01)

(52) U.S. Cl.
CPC .............. *H01L 24/75* (2013.01); *H01L 24/95* (2013.01); *H01L 25/0753* (2013.01); *H01L 33/0093* (2020.05); *H01L 33/0095* (2013.01); *H01L 33/36* (2013.01); *H01L 33/44* (2013.01); *H01L 33/62* (2013.01); *H01L 2224/95* (2013.01); *H01L 2933/0016* (2013.01); *H01L 2933/0025* (2013.01); *H01L 2933/0066* (2013.01)

(56) References Cited

U.S. PATENT DOCUMENTS

| | | |
|---|---|---|
| 5,611,884 A | 3/1997 | Bearinger et al. |
| 5,976,691 A | 11/1999 | Noguchi et al. |
| 6,514,782 B1 | 2/2003 | Wierer, Jr. et al. |
| 2003/0087476 A1 | 5/2003 | Oohata et al. |
| 2004/0154733 A1 | 8/2004 | Morf |
| 2004/0195576 A1* | 10/2004 | Watanabe ............... H01L 33/62 257/79 |
| 2006/0160257 A1 | 7/2006 | Wu et al. |
| 2006/0260648 A1 | 11/2006 | Lin et al. |
| 2007/0000592 A1 | 1/2007 | Fares et al. |
| 2008/0182076 A1 | 7/2008 | Kondo et al. |
| 2010/0317132 A1 | 12/2010 | Rogers et al. |
| 2011/0136324 A1 | 6/2011 | Ashdown |
| 2012/0038047 A1 | 2/2012 | Do et al. |
| 2012/0090056 A1 | 4/2012 | Hirooka et al. |
| 2012/0168089 A1 | 7/2012 | Schmidt-Lange et al. |
| 2013/0010435 A1* | 1/2013 | Ogatsu ................ H05K 9/0032 361/748 |
| 2013/0130440 A1 | 5/2013 | Hu et al. |
| 2013/0285107 A1 | 10/2013 | Schubert et al. |
| 2013/0300812 A1 | 11/2013 | Bibl et al. |
| 2013/0313587 A1 | 11/2013 | Lin |
| 2014/0000793 A1 | 1/2014 | Takahashi et al. |
| 2014/0008813 A1 | 1/2014 | Golda et al. |
| 2014/0048825 A1 | 2/2014 | Hsieh |
| 2014/0084240 A1 | 3/2014 | Hu et al. |
| 2014/0091347 A1 | 4/2014 | Shirakawa et al. |
| 2014/0094878 A1 | 4/2014 | Gossler et al. |
| 2014/0238592 A1 | 8/2014 | Marinov et al. |
| 2014/0240618 A1 | 8/2014 | Oraw |
| 2014/0319497 A1* | 10/2014 | Cho ..................... C09J 133/066 257/40 |
| 2017/0200707 A1 | 7/2017 | Rogers et al. |
| 2017/0365499 A1 | 12/2017 | Marinov |

FOREIGN PATENT DOCUMENTS

| | | |
|---|---|---|
| JP | 2004537158 | 12/2004 |
| JP | 2005012034 | 1/2005 |
| JP | 2014072351 | 4/2014 |
| KR | 2012-0065273 | 6/2012 |
| WO | 2013074373 | 5/2013 |
| WO | 2013189949 | 12/2013 |
| WO | 2014073963 | 5/2014 |

OTHER PUBLICATIONS

Notice of Allowance for Japanese Patent Application No. 2017-513498, dated Jan. 15, 2019.
Extended European Search Report for European Patent Application No. 14903978.6, dated Apr. 30, 2018.
International Search Report and Written Opinion for International Patent Application No. PCT/US2014/061053, dated Jul. 23, 2015.
Notice of Allowance for U.S. Appl. No. 15/512,342, dated Sep. 24, 2018.
Office Action for Chinese Patent Application No. 201480082033.3, dated Jul. 20, 2018.
Office Action for Japanese Patent Application No. 2017-513498, dated May 30, 2018.
Office Action for U.S. Appl. No. 15/512,342, notified on Mar. 9, 2018.
Restriction Requirement for U.S. Appl. No. 15/512,342 notified Nov. 27, 2017.
Annaiyan, U et al., "Development of a Conductive Photoresist with a mixture of SU-8 and HCl doped polyaniline", RMIT University. Downloaded on Aug. 6, 2009.
Bower, C.A. et al., "Active-Matrix OLED Display Backplanes Using Transfer-Printed Microscale Integrated Circuits", IEEE; 2010 Electronic Components and Technology Conference, pp. 1339-1343.
Park, S et al., "Printed Assemblies of Inorganic Light-Emitting Diodes for Deformable and Semitransparent Dipslays", Science (print ISSN 0036-8075; online ISSN 1095-9203), American Association for the Advancement of Science, 1200 New York Avenue NW, Washington, DC 20005. Copyright 2009 by the American Association for the Advancement of Science.
Park, S et al., "Printed Assemblies of Inorganic Light-Emitting Diodes for Deformable and Semitransparent Displays", www.sciencemag.org/cgi/content/full/325/5943/977/DC1; Published Aug. 21, 2009, Science 325, 977 (2009); DOI: 10.1126/science.1175690.
Rogers, J.A. et al., "High-Efficiency, Microscale GaN Light-Emitting Diodes and Their Thermal Properties on Unusual Substrates", small 2012, vol. 8, No. 11, Jun. 11, 2012, pp. 1643-1649.
Notice of Allowance for Chinese Patent Application No. 201480082033. 3, dated May 9, 2019.
Office Action for Korean Patent Application No. 2017-7007178, dated Nov. 8, 2019.

* cited by examiner

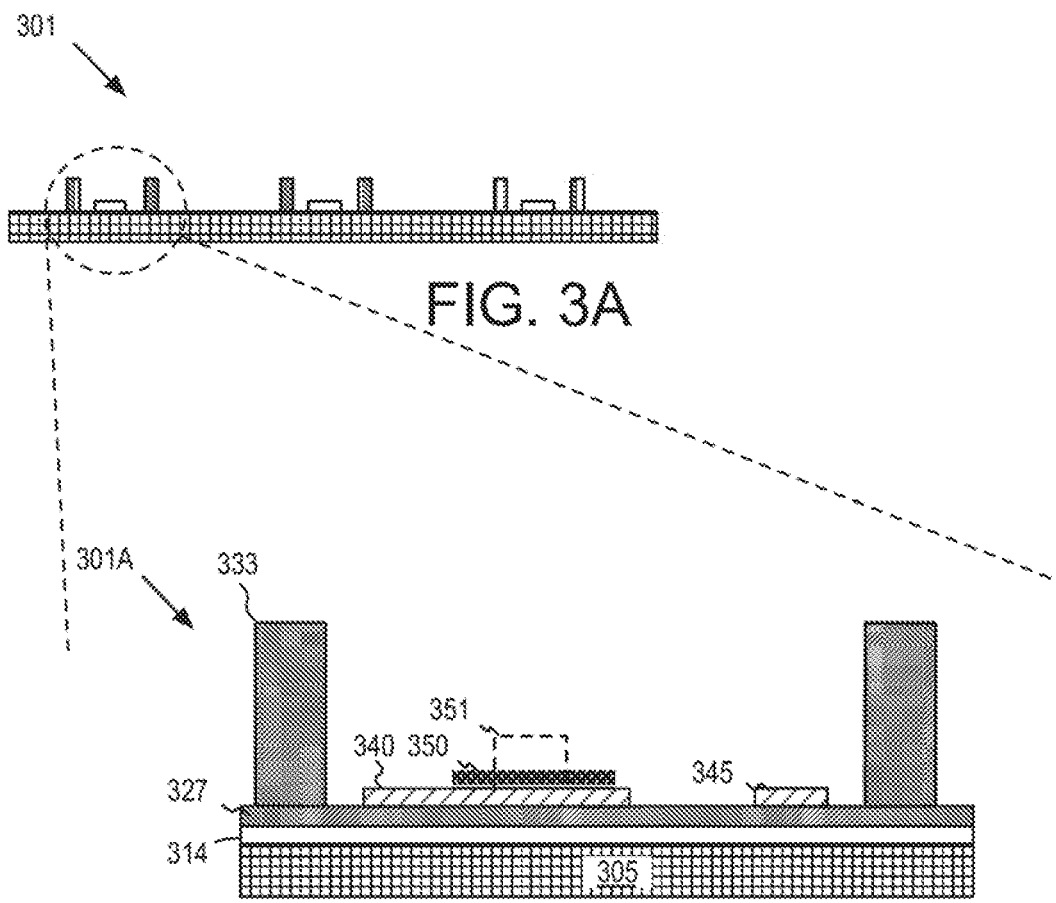
FIG. 3A
FIG. 3B
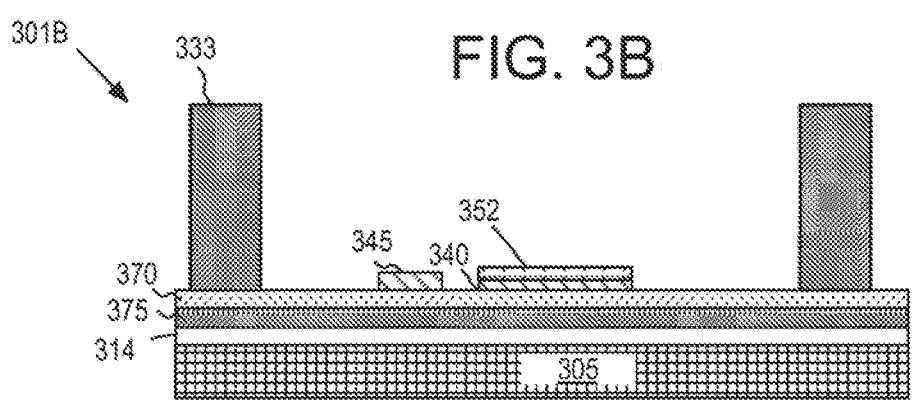
FIG. 3C

DISPLAY INCLUDING AN LED ELEMENT HAVING A PRESSURE SENSITIVE ADHESIVE (PSA) FOR MICRO PICK AND BOND ASSEMBLY OF THE DISPLAY

CLAIM FOR PRIORITY

This Application is a Divisional of U.S. patent application Ser. No. 15/512,342, filed on 17 Mar. 2017, and titled "MICRO PICK AND BOND ASSEMBLY", which is a National Stage Entry of, and claims priority to, PCT Application No. PCT/US14/61053, filed on 17 Oct. 2014 and titled "MICRO PICK AND BOND ASSEMBLY", which is incorporated by reference in its entirety for all purposes.

BACKGROUND

In contrast to conventional IC assemblies that integrate a number of IC chips or die having millimeter lateral chip dimensions onto a substrate, micro device assemblies integrate electronic and/or photonic devices having lateral chip dimensions in the micrometer regime (e.g., 1-10 µm). Die isolation, handling, bonding, and interconnection are all more of a challenge for micro device assemblies than conventional IC assemblies. For example, traditional pick-and-place methods can handle devices down to ~200 µm in the lateral (XY) dimensions and 100 µm in thickness (Z). Due to this large chip thickness, it is difficult to form interconnects that allow miniaturization of the package.

Micro device assembly techniques under development include so-called transfer printing methods that have been shown capable of integrating into an assembly micro dice having lateral dimensions in the 10's of micrometers and ~1 µm in Z thickness. One exemplary transfer printing technique relies on a sophisticated MEMS print head providing thousands of electrostatic clamping points. Another exemplary transfer printing technique relies on low temperature bonding with polydimethylsiloxane (PDMS), which is not compatible with high temperature chip bonding techniques, like solder bonding.

Electronic displays are one area that may benefit from advanced micro device assembly techniques. Electronic display technology has advanced rapidly in recent years as an important user interface to electronic devices. To date, liquid crystal display (LCD) technology has been the dominant display technology for both large format (e.g., television) and mobile devices. Current LCD based displays however only pass through µ5% of light from a backlight source (e.g., LED or CFL, etc.) leading to poor power efficiency, insufficient daylight display illumination, and poor viewing angles.

Considerable research and development has been expended on organic light emitting diode (OLED) display technology. OLED displays improve display power efficiency, though not dramatically, relative to LCD. OLED technology also currently suffers from color fading, leading to decreased display endurance/lifetime. Another next-gen display technology under investigation is crystalline LED, also referred to as inorganic LED (iLED). A crystalline LED display relies on an array of crystalline semiconductor LED chips. A crystalline LED display, for example, may utilize one LED chip for one picture element, or pixel. The power efficiency of crystalline LED is one order of magnitude more efficient than that of OLED, however a high volume manufacturing process has not been demonstrated for display applications. One of the technical challenges of crystalline LED is that a vast number of very small crystalline LEDs need to be transferred from a monolithic growth/fabrication medium into a spatially larger array electrically interconnected in a manner that enables controlled light emission. For current display resolutions (e.g., HD), one may expect hundreds of thousands of crystalline LED elements within a 1" square of display area with each crystalline LED element on the micron scale (e.g., 5 µm, or less on a side).

Micro-bonding techniques capable of assembling crystalline LED displays are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements. Further, where considered appropriate, reference labels have been repeated among the figures to indicate corresponding or analogous elements. In the figures:

FIGS. 3A, 3B, and 3C are cross-sectional views of exemplary structures in a µPnB target substrate, in accordance with embodiments;

DETAILED DESCRIPTION

Figure 1:
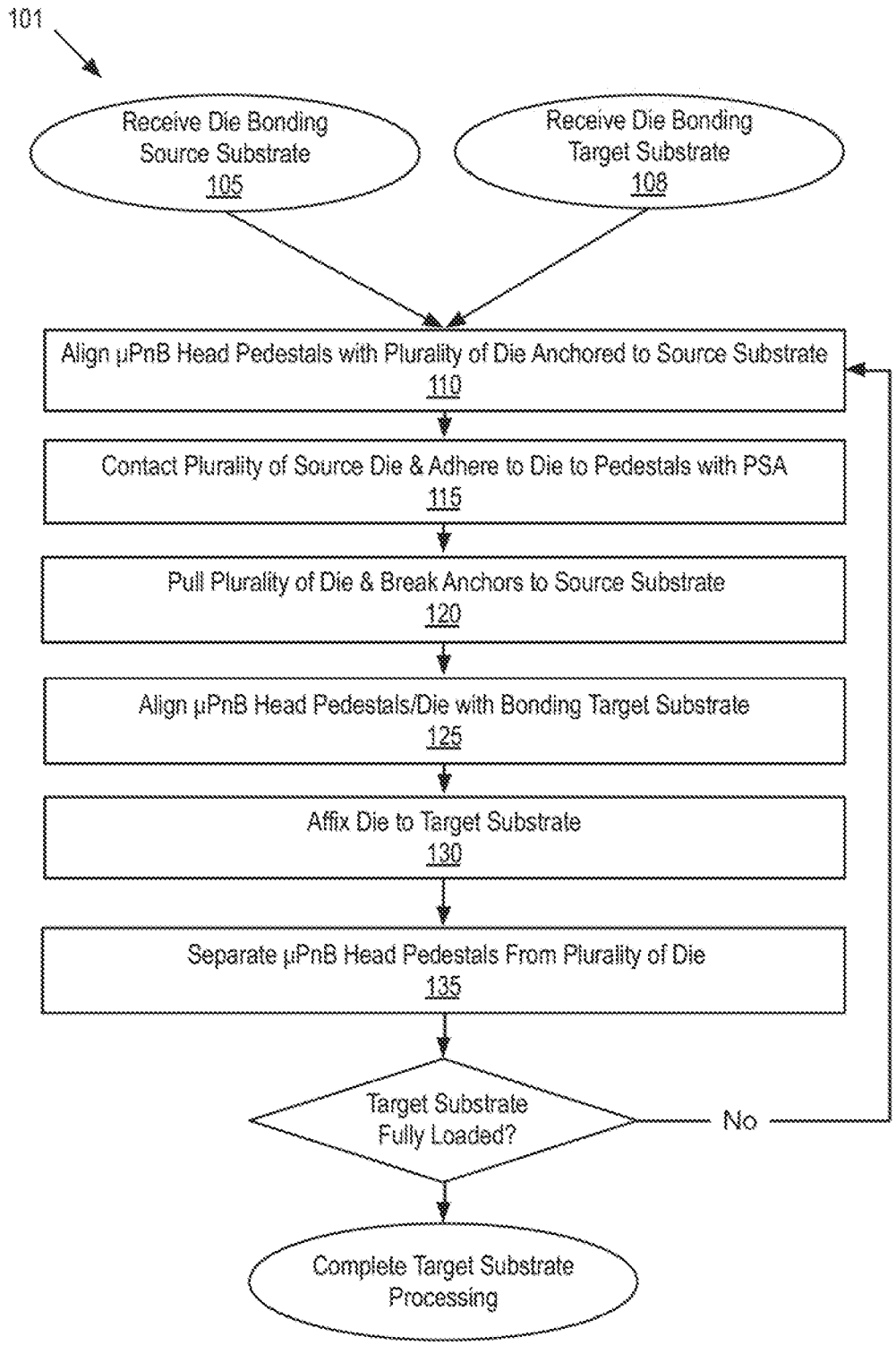
FIG. 1 is flow diagram illustrating a micro-pick-and-bond (µPnB) method suitable for integrating micro device elements into an assembly, in accordance with embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments of the present invention may be practiced without these specific details. In some instances, well-known methods and devices are shown in block diagram form, rather than in detail, to avoid obscuring embodiments of the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used in the description, and in the claims, a list of items joined by the term "at least one of" or "one or more of" can mean any combination of the listed terms. For example, the phrase "at least one of A, B or C" can mean A; B; C; A and B; A and C; B and C; or A, B and C. Described herein are micro pick and bond assembly techniques, micro pick-and-bond (μPnB) assembly equipment, and micro device assemblies. In contrast to known transfer printing methods, μPnB methods can integrate micro-devices without the complexity of high voltage electrostatic heads, and are compatible with high temperature solder bonding. In embodiments, micro pick-and-bond heads transfer micro device elements, such as (micro) LEDs, en masse from a source substrate to a target substrate, such as a LED display substrate. Anchor and release structures on the source substrate enable device elements to be separated from a source substrate, while pressure sensitive adhesive (PSA) enables device elements to be temporarily affixed to pedestals of a micro pick-and bond head. Once the device elements are permanently affixed to a target substrate, the PSA interface may be defeated through peeling and/or thermal decomposition of an interfacial material. The μPnB heads and assembly techniques described herein are particularly advantageous for integrating hundreds of thousands to many millions of micro devices onto an assembly substrate, for example to assemble a μLEDs into a display.

In certain exemplary embodiments described further below, a μPnB assembly head is completely passive, having no electrical components or circuitry, such as electrodes. A purely mechanical μPnB assembly head has the advantage of being less complex than electrically controlled heads such as those employing electrostatic force to pick up micro dice. In contrast to an electrostatic head, a passive μPnB assembly head in accordance with one or more embodiment described herein lacks electrostatic clamping electrodes. There is therefore no need for active high voltage control, and no need to build up and bleed off an image charge in each of the die during the assembly process.

A number of μPnB assembly embodiments are described in detail below in the context of μLEDs and μLED displays. It is noted however that the various features of μPnB exemplified with the μLED embodiments for the sake of consistency and clarity of description may be readily applied to any micro device electronic, photonic, or otherwise (e.g., MEMS).

FIG. 1 is flow diagram illustrating a micro-pick-and-bond (μPnB) method 101 suitable for assembling micro device elements (e.g., micro die) into an assembly, in accordance with embodiments. In one exemplary embodiment, the device elements are μLED dice assembled into a display assembly. Method 101 begins with receiving a die bonding source substrate at operation 105 and a die bonding target substrate at operation 108. The μPnB method 101 is to transfer one or more of the die from the source substrate to the target substrate. The die has lateral dimensions in the micron scale, for example no more than 10 μm. In the exemplary μLED embodiment, the μLED (also referred to herein simply as an LED) has a largest lateral length no more than 5 μm. The μPnB method 101 is highly scalable being suitable for devices (e.g., LEDs) in the 1-5 μm range, for example. For such embodiments, method 101 may be utilized for example to assemble a crystalline LED display. Although described herein in the context of a few or even a single device for the sake of clarity, the source substrate embodiments, target substrate embodiments, and μPnB assembly techniques exemplified are also understood to be applicable to concurrent pick-and-bond/assembly of a vast number of devices.

Figure 2A:
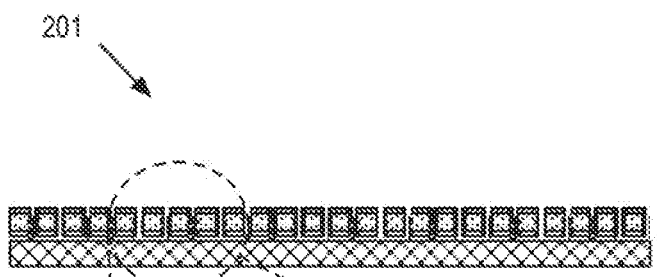
FIGS. 2A, 2B, and 2C are cross-sectional views of exemplary crystalline LED elements in a µPnB source substrate, in accordance with embodiments.
Figure 2B:
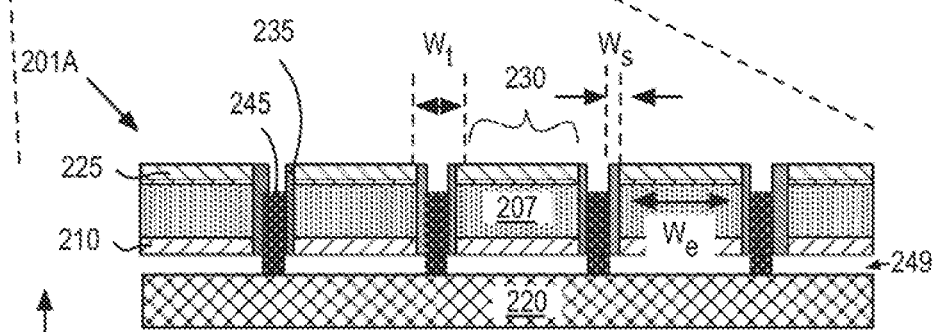
Figure 2C:
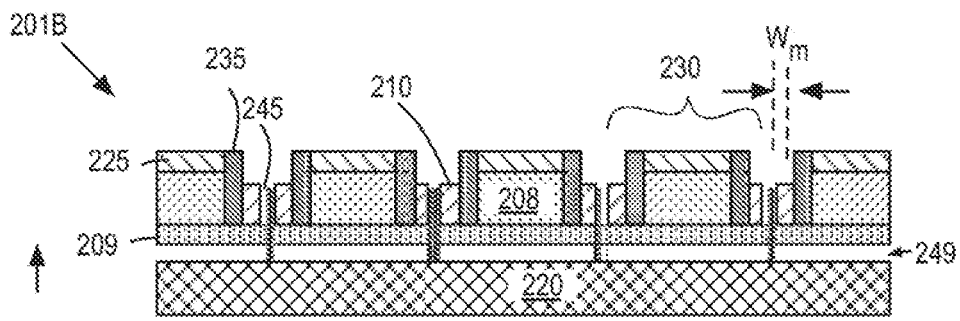

In an embodiment, the source substrate received at operation 105 includes a plurality of devices, each including a device stack that has been fabricated at a wafer-level with some nominal source substrate device pitch. One or more of the devices in the source substrate are to be picked up and bonded to the target substrate, for example at some target substrate device pitch that may be an integer multiple of the source substrate device pitch to reduce wasted space on the source substrate. FIG. 2A is cross-sectional view of exemplary crystalline LED elements integrated in a μPnB source substrate 201, in accordance with embodiments. FIGS. 2B and 2C are expanded cross-sectional views of two alternative embodiments (201A and 201B) for μPnB source substrate 201, in accordance with further embodiments.

Referring first to FIG. 2B, source substrate 201A includes a carrier 220, which may be any metal, semiconductor, or dielectric material having adequate flatness as subsequent bulk transfer of the LED elements from carrier 220 may be facilitated by greater flatness of carrier 220. In one advantageous embodiment, carrier 220 is a (mono)crystalline silicon substrate, for example a wafer of the type employed for IC fabrication. In another advantageous embodiment, carrier 220 is a glass substrate.

Source substrate 201A further includes crystalline LED elements 230 anchored to carrier 220. LED elements 230 may be rectangular (e.g., square) or patterned to have alternative shapes (e.g., a circular footprint). Each element 230 includes a LED film stack 207. Generally, any known semiconductor LED film stack may be utilized. In embodiments, LED film stack 207 includes one or more semiconductor heterojunction(s), for example forming a quantum well, etc. Semiconductor LED film stack 207 includes at least two complementary doped semiconductor regions (layers): a p-type doped layer and an n-type doped layer in a diodic stack architecture. In specific embodiments, semiconductor LED film stack 207 is a heteroepitaxial III-N semiconductor film stack, for example comprising GaN and/or alloys thereof, such as InGaN. The composition of semiconductor LED film stack 207 however is dependent on the desired emission band, and embodiments herein are not limited in that respect.

Each LED element 230 further includes an electrode metal 210 contacting the LED film stack. The composition of electrode metal 210 may vary as a function of the LED film stack, for example to provide a desired metal work function suitable for providing an ohmic contact, tunneling contact, etc. In one exemplary embodiment, metal 210 is a p-type metal suitable for making contact to p-type doped semiconductor layer of an LED film stack. Each LED element 230 further includes a second metal electrode 225 contacting the LED film stack. The composition of second electrode metal 225 may vary as a function of the LED film stack, for example to provide a desired metal work function suitable for providing an ohmic contact, tunneling contact, etc. In one exemplary embodiment, metal 225 is an n-type metal suitable for making contact to n-type doped semiconductor layer of an LED film stack.

Adjacent LED elements 230 are separated by trenches etched into the LED semiconductor film stack. The dimensions/pitch of the trenches substantially set the dimensions of the LED elements that will be incorporated into a display assembly. As illustrated in FIG. 2B, the trenches between LED elements 230 extend through the metal electrodes 225 and 210, and through the entire semiconductor LED film stack 207, defining sidewalls of each LED element. A dielectric sidewall spacer 230 is disposed over the LED element sidewalls. Sidewall spacer dielectric 235 may be any known dielectric material, such as but not limited to amorphous Si/C, $SiO_x$, SiON, SiN, CDO, and CDN. Dielectric sidewall spacer 230 is conformally deposited over the LED elements and anisotropically etched to form an at least partially self-aligned sidewall coating over the metal and semiconductor sidewalls of each LED element.

Figure 9:
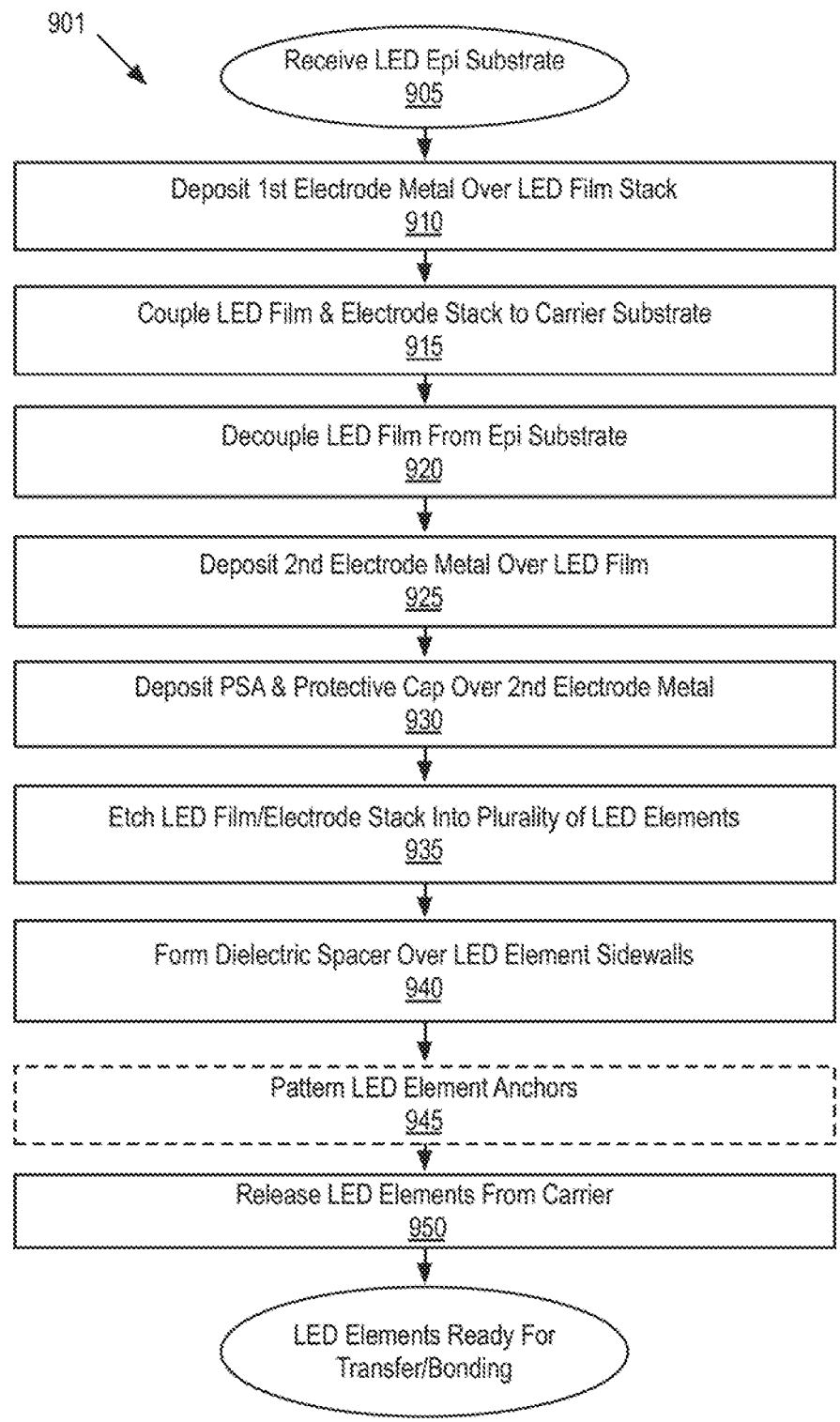
FIG. 9 is a flow illustrating a method of fabricating a µPnB source substrate including crystalline LED elements suitable for assembly into a display, in accordance with embodiments.

In exemplary embodiments, the lateral element width $W_e$ of each LED element 230 is patterned to be no more than 5 μm. In advantageous embodiments, the thickness of the dielectric material utilized for spacer formation is selected to ensure dielectric spacer 235 has a lateral thickness, or width $W_s$ that is less than half the nominal lateral width $W_t$ of the trenches 232 etched into the LED film stack at operation 935 (FIG. 9). The limitation on spacer width ensures two dielectric spacers on adjacent LED elements leave a portion of substrate material exposed at the bottom of the trenches to allow access of a release agent (e.g., substrate etchant). In exemplary embodiments, $W_s$ is less than 0.1 μm.

LED elements 230 are anchored to carrier 220 for a controlled release of the LED elements 230 from carrier 220. The LED element anchors are formed within the trenches between adjacent elements, for example intersecting portions of the LED element sidewalls while still leaving access for a release agent to undercut the LED elements. Anchor material may be back filled into the trenches, planarizing with a top surface of LED elements 230, for example with a spin-on process. The planarized anchor material may then be recessed below the top surface of LED and/or patterned into a plurality of separate anchors. The recessed anchors avoid contamination to the μPnB head during pick up and further allow reduction of anchoring strength to ease the pickup. In one advantageous embodiment, the anchor material is a photosensitive polymeric material (e.g., photoresist) spin-coated into the trenches. Resist recess can be accomplished with well-known techniques such as a blanket ashing (both positive and negative resists), image reversal (positive resist) or a blanket development (negative resist). The photoresist is then lithographically patterned (i.e., exposed and developed) into separate LED element anchors 245 filling the trench and maintaining separation between adjacent LED elements 230 as further illustrated in FIG. 2B. The LED elements 230 remain affixed to the carrier only by the anchors 245. Anchors 245 landing on carrier 220 are surrounded by a free-space void 249 extending over the entire lateral area or footprint of each LED element 230. In the exemplary embodiments where a photosensitive polymer is employed for the anchor material, each anchor 245 is a polymer pillar contacting the sidewall dielectric (spacer 235) coating at least two adjacent LED elements 230 (e.g., four nearest LED elements 230 are connected by each anchor 245). In the form illustrated in FIG. 2B, LED elements 230 are ready for pick up and bonding to an LED display assembly.

In the alternative embodiment illustrated in FIG. 2C, source substrate 201B also includes a plurality of LED elements 230 anchored to carrier 220. Each LED element 230 again includes an LED film stack, however dielectric spacer 235 extends along a sidewall of LED film stack semiconductor 208, and lands on p-type doped semiconductor 209. Dielectric spacer 235 separates LED film stack semiconductor 208 from a metal spacer providing a self-aligned p-type metal electrode 210. As one example, Al and/or Au can be etched with a chlorine-based dry etch process to form electrode 210 while leaving a Cu electrode 210 and SiN spacer dielectric 235 unetched. The self-aligned metal electrode 210 maintains contact (e.g., p-contact) to the doped semiconductor region 209. Metal electrode 210 may for example have a lateral width $W_m$ less than and 0.1 µm, and advantageously only a few hundred nanometers. LED anchors are disposed between elements 230 and surrounded by void 249. In the form illustrated in FIG. 2C, LED elements 230 are ready for pick up and bonding to an LED display assembly.

Returning to FIG. 1, the target substrate received at operation 108 includes a plurality of lands arrayed over a surface of the target substrate. The target substrate may for example be a large format substrate with each land having been patterned and/or plated up at some nominal target substrate device pitch. One or more of the devices in the source substrate are to be picked up and bonded to the lands on the target substrate, for example at the target substrate device pitch much greater than the source substrate device pitch.

FIG. 3A is a cross-sectional view of exemplary structures in a µPnB target substrate 301, in accordance with embodiments. FIGS. 3B and 3C are expanded cross-sectional views of two alternative embodiments (301A and 301B) for µPnB target substrate 301, in accordance with further embodiments. The µPnB target substrate 301A may be bonded, for example, with an LED element picked up from source substrate 201A (FIG. 2B). The µPnB target substrate 301B may be bonded, for example, with an LED element picked up from source substrate 201B (FIG. 2C).

Referring first to FIG. 3B, target substrate 301A includes a carrier 305. Carrier 305 can be either the display backplane, or a temporary substrate for building up the display. FIG. 3B further illustrates a temporary carrier embodiment in which carrier 305 is covered with a release layer 314. Release layer 314 may be any sacrificial material and in one example is a PSA material as further described below). Release layer 314 may also be an inorganic dielectric layer such as, but not limited to $SiO_x$, which may for example form a compression bond with carrier 305. After build-up, the LED display assembly may be removed at release layer 314 and carrier 305 is then available for reuse after release. Carrier 305 may therefore be of any substrate material known in the art to be suitable for build-up that has sufficient flatness and has a sufficiently large area to accommodate the desired display area. The exemplary embodiment illustrated in FIG. 3A further includes a dielectric protection layer 327 to protect the LED display assembly after build up and release from carrier 305. Exemplary protection layer materials include SiON, SiN, and CDN. In alternate embodiments, dielectric protection layer 327 is absent.

Disposed over the carrier 305 is a display backplane interface having first metal interconnects that are to interface a first LED electrode with a display blackplane (e.g., driving circuitry, access transistors, and/or discrete electronics, etc.). In the exemplary embodiment illustrated in FIG. 3A, first metal interconnects 340 are pads arrayed over carrier 305. For an exemplary embodiment where the LED display is to include an array of 5×5 µm LED elements, first metal interconnects 340 may be 10 µm metal pads having a pitch of around 25 µm. Second metal interconnects 345 are also metal pads arrayed (e.g., with a similar pitch) over carrier 305. Second metal interconnects 345 are to be electrically coupled to the second LED electrode, and so should be electrically isolated from first metal interconnects 340.

In embodiments, a µPnB target substrate has lands that include a solder feature or a conductive adhesive element. Target substrate 301A illustrates a conductive adhesive 350 applied to metal interconnect 340. Conductive adhesive 350 is to receive an LED element, affix the LED element to the bonding target substrate while the LED display assembly is built up around the LED element. In the exemplary embodiment, conductive adhesive 350 is to electrically connect one of the metal interconnects 340 to a metal electrode on a first (back) side of an LED element. In one advantageous embodiment, the conductive adhesive is a structural adhesive such as a photosensitive conductive film (e.g., a conductive photoresist). An example of such material is a photoresist (e.g., SU-8 25) doped with a conductive polymer (e.g., polyaniline). Some conductive photoresist formulations have been described in technical literature as having a resistivity in the range of 1 ohm-cm. At this resistivity, parasitic electrical resistance attributable to the conductive polymer of around 0.5 µm thick, employed in accordance with embodiments herein is expected to be in the range of ~200 ohms for a 5×5 µm LED element. This resistance is much smaller than typical (p-type) contact resistance (e.g., >2 kohm) for an element of this size. Patterning and alignment of the conductive polymer elements is non-critical. For an exemplary 10 µm metal interconnect pad, the conducting polymer element may have a lateral dimension of 10-15 µm on a 25 µm pitch.

In another embodiment also illustrated in FIG. 3B, a solder element 351 is employed instead of a conductive adhesive 350 to permanently affix the die to the target substrate. Solder feature 351 may be a post or other structure of a solder material or a laminate stack of solder materials known to be compatible for any high temperature (e.g., over 150° C.) bonding process utilized for millimeter scale pick-and-place/compression bonding techniques. In one exemplary embodiment, solder feature 351 includes indium (In), which melts in the range of 160-180° C. Solder feature 351 may further include a Au layer that will also melt at similar temperature to form a Au—In alloy with a significantly higher (re)melt temperature. A bilayer of Au—Ti may also provide similar performance. Regardless of the solder material however, it is noted that the relatively high temperatures of solder bonding place additional constraints on the µPnB techniques described herein. For example, stand-off 333 is advantageously a material stable at high temperatures (e.g., stable to at least 190° C.) so that the high temperature bonding techniques may be utilized. In one example, stand-off 333 is a photoresist, such as SU-8.

In an embodiment, a µPnB target substrate further includes at least one mechanical stand-off adjacent a die land. Such stand-offs need not be adjacent to every die land on a source substrate, and may for example be distributed sparsely over the target substrate with enough density to ensure planar engagement between the µPnB head and the target substrate. FIG. 3B illustrates an exemplary stand-off 333 having a z-height greater than a z-height of the die (LED) land added to a z-height of a die (LED element) relative to the plane of the μPnB head to be affixed to the land. The mechanical stand-off(s) may be distinguished from a conventional collapse controller in that the stand-off is not to set a final z-height between a die and land, but rather to provide a mechanical stop to a surface of a μPnB head delivering the die as described further below. In exemplary embodiments where the z-height of the die land is a few microns or less (e.g., ~1 μm), stand-off 333 may be 6 μm, or less for a die z-height extending 5 μm from the μPnB head (e.g., LED 230 in FIG. 5B). In certain embodiments, stand-off 333 is a sacrificial material that is removed following die bond. In one such embodiment, stand-off 333 is photosensitive (e.g., a photoresist such as but not limited to SU-8). In such embodiments, stand-off 333 may be lithographically patterned, exposed and subsequently removed with known techniques.

In another embodiment, an optically transmissive adhesive is employed to affix the die to the target substrate. Referring to FIG. 3C, bonding target substrate 301B likewise includes a metal interconnects 340, 345, for example arrayed over a surface of carrier 305 at pitches and dimensions substantially as described above for target substrate 301A. In this exemplary embodiment, target substrate 301B includes a display cover 375 that may be of any material known to be suitable for display cover applications, such as but not limited to, glass and sapphire ($Al_2O_3$). A touch sensor layer 370 may be further included in target substrate 301B, with metal interconnects 340, 345 disposed over display cover 375. Instead of conductive adhesive or solder, each die land includes optically transmissive adhesive 352. LEDs on substrate 201B in FIG. 2C are suitable for bonding to such target substrates. Since the LED light emission will be directed towards display cover 375, in one advantageous embodiment, passing through optically transmissive (e.g., transparent) adhesive 352.

Figure 4A:
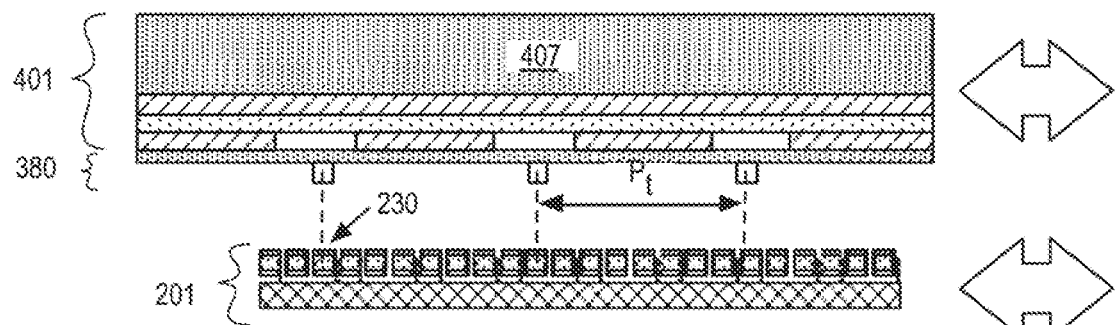
FIGS. 4A, 4B, and 4C are cross-sectional views of exemplary operations as pick operations in a µPnB method are performed, in accordance with embodiments.
Figure 4B:
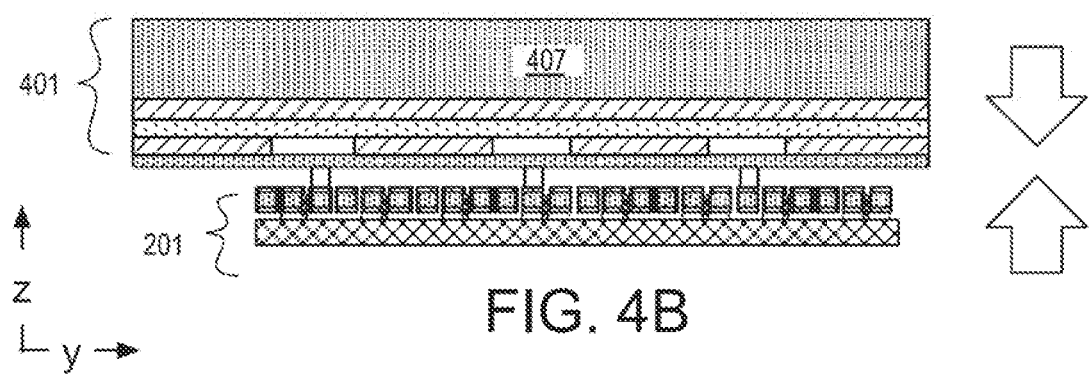
Figure 4C:
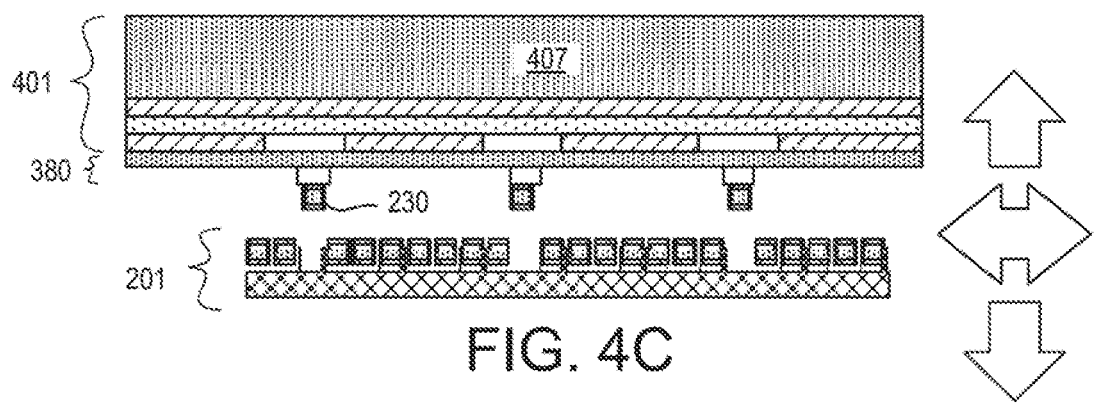

Returning to FIG. 1, μPnB assembly method 101 continues with die pickup beginning at operation 110 where a plurality of pedestals on a μPnB head are aligned with a plurality of die or device elements anchored to the source substrate. FIGS. 4A, 4B, and 4C are cross-sectional views of exemplary operations as pickup operations in μPnB method 101 are performed, in accordance with exemplary LED embodiments. As shown in FIG. 4A, a μPnB head 401 includes a plurality of monolithic microtools 380 arrayed over a μPnB head substrate 407. The microtools 380 are arranged at a target pitch $P_t$ predetermined to match or accommodate a particular land pitch on the bonding target substrate. The pedestal pitch $P_t$ is further a multiple of the source device (LED element) pitch on the source substrate so that the plurality of microtools 380 may be concurrently aligned with a plurality of LED elements 230.

Returning to FIG. 1, μPnB assembly method 101 continues at operation 115 where the plurality of source die are contacted and adhered to the μPnB head pedestals with a pressure sensitive adhesive (PSA). As used herein, a PSA is an adhesive which forms bond when pressure is applied to adhere the adhesive with the adherend (e.g., the pedestal surface and/or die surface). A PSA is distinct from a structural adhesive typically employed to form a permanent bond. Whereas structural adhesives harden via processes such as solvent evaporation, UV radiation induced reactions, component reactions or thermal setting, no solvent (e.g., water), heat, or other cure (e.g., UV) is needed to activate the PSA. Once the PSA and adherend are in proximity, molecular interactions (e.g., van der Waals forces) prefect the bond. Pressure-sensitive adhesives are typically characterized by their shear and peel resistance as well as initial tack. The bond strength may be further influenced by the interface surface chemistry and the amount of pressure employed to press the plurality of die against the μPnB head pedestals. In advantageous embodiments, the PSA material employed at operation 115 is stable at high temperatures to facilitate subsequent bonding of die to a target substrate. In one exemplary embodiment the PSA material employed at operation 115 is stable to at least 180° C. and ideally stable at 250° C., or more (e.g., 300° C.). PSA material employed at operation 115 maintains sufficient shear strength to retain the die-pedestal bond at elevated die bond temperatures. In one exemplary embodiment, the PSA material employed at operation 115 is a silicon-based material including a siloxane polymer (Si—O—Si). As further shown in FIG. 4A, μPnB head 401 has been displaced in the z-direction to bring a bonding surface of microtools 380 in contact with a bonding surface of LED elements 230. The PSA material has been pre-applied to least one of these bonding surfaces and is pressed between the source substrate 201 and μPnB head substrate 407.

Returning to FIG. 1, μPnB assembly method 101 continues at operation 120 where the anchors between the die and the source substrate are broken by displacing the μPnB head pedestals relative to the source substrate while the die are adhered to the pedestals with the PSA material. The peel strength of the PSA material is compatible with the bond strength of the source substrate anchors to ensure the PSA bond can overcome the source substrate anchor. In exemplary μLED embodiments, a PSA peel strength less than 1 N/cm may be adequate for properly selected anchor materials and designed structures. In an exemplary embodiment, the anchoring force on a 5 μm×5 μm LED can be less than 10 μN vs. a peel force of 100 μN with a peel strength of 0.2 N/cm. As further depicted in FIG. 4C, μPnB head 401 is displaced at least in the z-direction relative to the source substrate 201. In some embodiments, the μPnB head 401 may also be laterally displaced relative to source substrate 201 in an effort to overcome the anchors shear strength. Upon completion of operation 120, a PSA bond affixes a plurality of LED elements 230 to a plurality of μPnB head microtools 380.

Figure 5A:
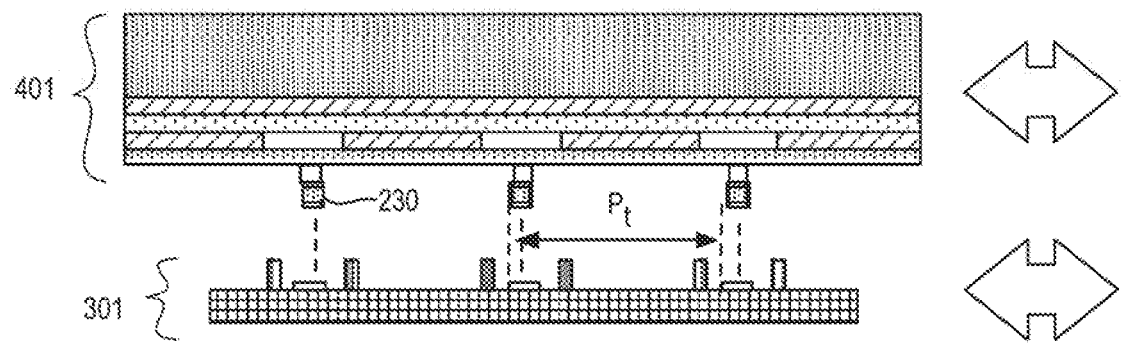
FIGS. 5A, 5B, and 5C are cross-sectional views of exemplary operations as bond operations in a µPnB method are performed, in accordance with embodiments.
Figure 5B:
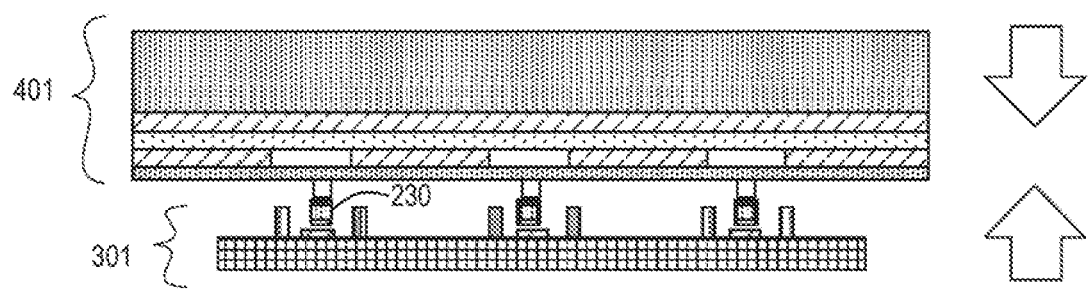
Figure 5C:
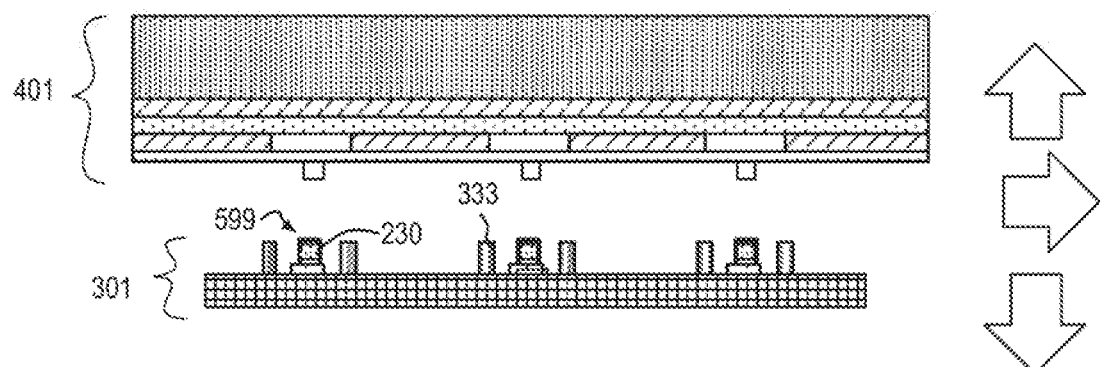

Returning to FIG. 1, μPnB assembly method 101 continues to the bonding stage where the dies picked up at operation 120 are now transferred to a target substrate. At operation 125, the plurality of die affixed to the μPnB head pedestals are aligned with lands on a bonding target substrate. At operation 130, the plurality of die is affixed to the lands of the bonding target substrate. Operation 130 may entail any solder bond/compression bond process known to be suitable for die on the millimeter scale. FIGS. 5A, 5B, and 5C are cross-sectional views of exemplary operations as the bond operations in μPnB method 101 are performed, in accordance with exemplary LED embodiments. As shown in FIG. 5A, working surfaces of microtools 380 at the target pitch $P_t$ are aligned to lands on the bonding target substrate 301. FIG. 5B illustrates the LED elements 230 being joined to the target substrate 301 as the μPnB head 401 is pressed against the target substrate 301. In one example, target substrate 301 is heated to slightly below a solder reflow/melt temperature, while the μPnB head 401 is heated to a temperature above the solder reflow temperature. Pressure may be applied between μPnB head 401 and target substrate 301. The μPnB head 401 locally heats the solder feature above the solder reflow temperature, forming a solder joint that is then cooled. Alternatively, operation 130 may entail an adhesive bond process including, for example, a UV or thermal curing and/or drying of a structural adhesive pre-applied to the target substrate or pre-applied to the die while the die is temporarily affixed to μPnB head 401. In one advantageous embodiment, room temperature compression bonding is employed to affix the plurality of LED elements 230 to conductive adhesive elements on target substrate 301. In a further embodiment, the room temperature bond is utilized for an initial bond, which is followed with a high temperature (e.g., 140-180° C.) curing, and/or UV curing of the conductive adhesive.

Returning to FIG. 1, the PSA bond between each micro die/chip and each assembly head pedestal is then broken or otherwise defeated at operation 135, leaving the die affixed to the target substrate. In one exemplary embodiment, the PSA bond between the die and the μPnB head pedestal is defeated by displacing the μPnB head pedestals relative to the target substrate while the die are affixed to the lands. In one embodiment further illustrated in FIG. 5C, the μPnB head pedestals are peeled from the die by concurrently displacing the μPnB head 401 laterally (e.g., y-dimension) and vertically (e.g., z-dimension) relative to the target substrate 301. Peeling force may be precisely controlled through a number of parameters, including for example the footprint of the die, which may be circular so that the peeling force is initially low and advantageously always below a maximum force that occurs only at the maximum die diameter. Upon peeling of the μPnB assembly head, some PSA residue may be left on micro die top surfaces 599 or the surface of pedestal 380. Such a PSA residue may be removed with solvent provided that PSA is stable through the bonding process. If not removed, the PSA residue may remain to various extents on die top surfaces 599, the presence of such residue on at least a subset of the die is therefore indicative of assembly methods employing PSA in accordance with embodiments.

In another embodiment, a sacrificial material interfacing the PSA material is decomposed to break the PSA bond between die and the μPnB head pedestals. In advantageous embodiments, the sacrificial interface material is present on the die-side of the PSA material. This enables the PSA material to remain on the μPnB head pedestals for reuse during a subsequent iteration of method 101. As one example, the sacrificial interface material is a thermally decomposable material pre-applied to the die. The thermally decomposable material may be thermally decomposed at operation 135. As described further below, polycarbonate is one example of a thermally decomposable material that may be utilized to effect separation between μPnB head pedestals and the die at temperatures of 250° C., or more. In one such embodiment, an elevated temperature employed at the bonding operation 130 is insufficient to decompose the thermally decomposable material (e.g., <250° C.), but is sufficient to form a solder alloy (e.g., >160° C.) that has a (re)melt temperature (e.g., >350° C.) above the thermal decomposition temperature of the thermally decomposable interface material. Once the high melt temperature alloy is formed at operation 130 (e.g., at 180-200° C.), operation 135 may entail heating to a higher temperature (e.g., 250-300° C.) to thermally decompose the sacrificial material.

The μPnB assembly method 101 may then be iterated through the pickup and bonding operations described above until a die (e.g., LED element) is bonded to all lands on the target substrate. After attaching all source dice to the target substrate, the target substrate may be further processed to complete interconnection and/or encapsulation of the micro devices assembled onto the target substrate. Any assist structures (e.g., standoffs 333) fabricated on the target substrate to facilitate μPnB assembly may also be removed.

Figure 6A:
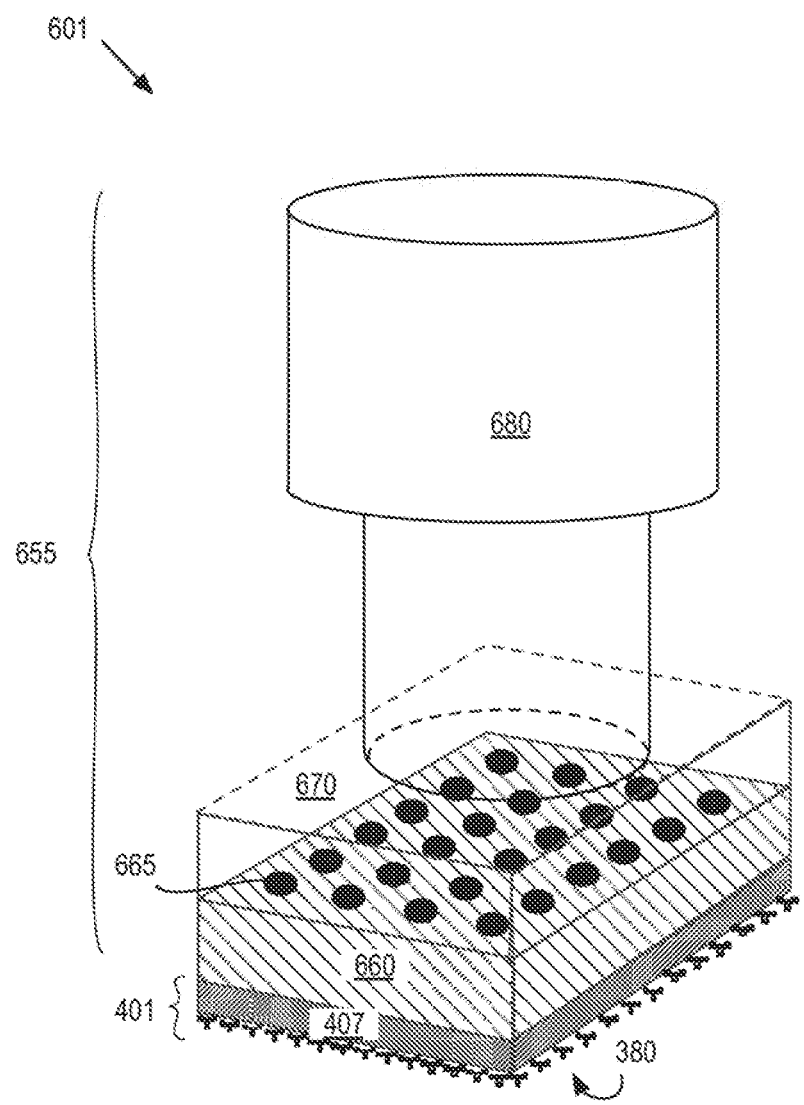
FIG. 6A is an isometric view of an exemplary µPnB assembly tool, in accordance with embodiments.
Figure 6B:
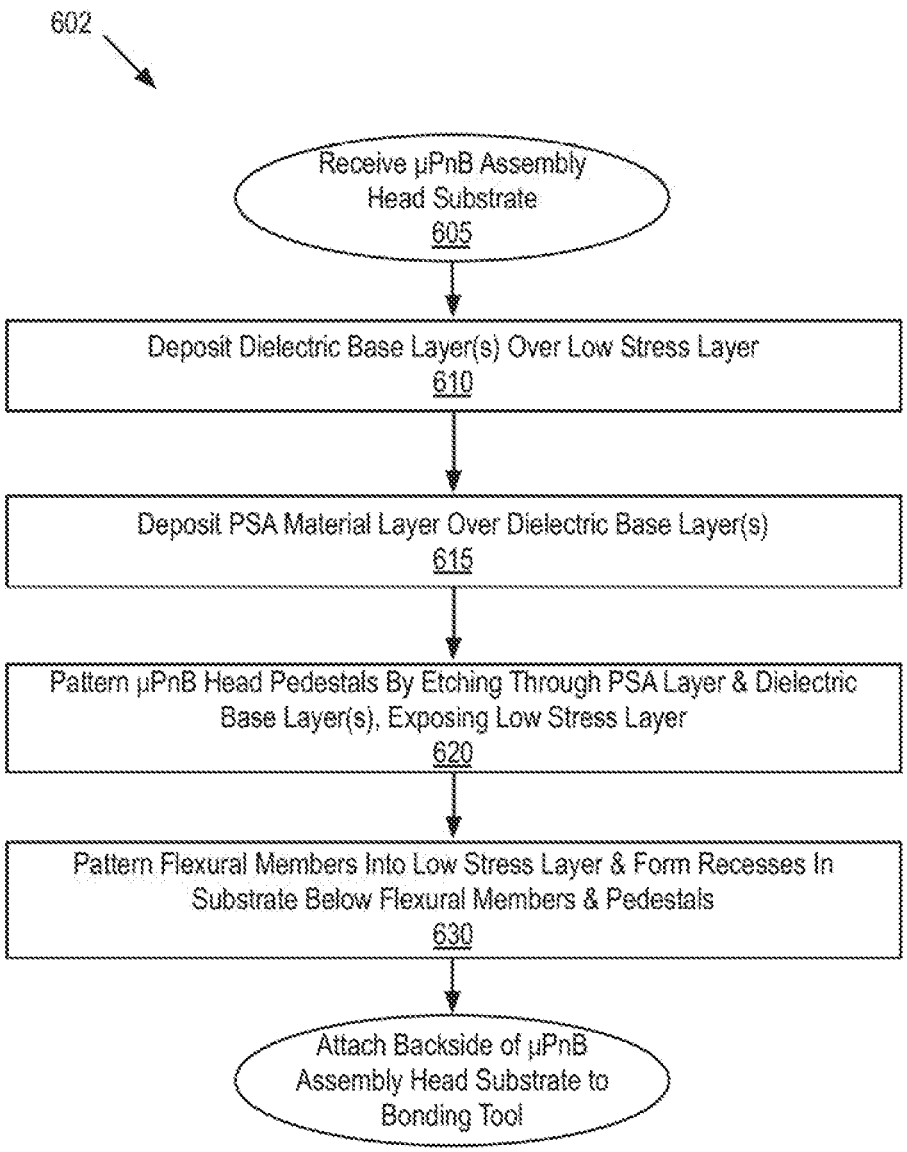
FIG. 6B is flow diagram illustrating a method of fabricating a µPnB head with the µPnB assembly tool illustrated in FIG. 6A, in accordance with embodiments.

Notably, successful execution of μPnB assembly method 101 depends, at least in part, on the source and target substrates having sufficient flatness, and/or the μPnB assembly head having sufficient flatness. In advantageous embodiments, the μPnB assembly head includes microtools capable of accommodating a threshold level of non-planarity between the μPnB assembly head pedestals and the target substrate. FIG. 6A is an isometric view of an exemplary μPnB assembly tool 601 that may be utilized to perform μPnB assembly method 101, in accordance with embodiments. FIG. 6B is flow diagram illustrating a method 602 for fabricating μPnB assembly head 401 incorporated into the μPnB assembly tool 601, in accordance with certain embodiments where the PSA material is provided on the μPnB assembly head pedestals. FIG. 7A-7G are cross-sectional views of an exemplary μPnB assembly head as selected operations in method 602 are performed, in accordance with first embodiments. FIG. 8A-8D are cross-sectional views of an exemplary μPnB head as selected operations in method 602 are performed, in accordance with alternate embodiments.

Referring first to FIG. 6A, μPnB assembly tool 601 includes a die compression bonder 655 fitted with μPnB assembly head 401. In the example illustrated in FIG. 6A, compression bonder 655 includes an articulated robotic arm or gantry 680. As in typical thermal compression bonding tools, the gantry 680 may contain mechanisms for moving the tool around in XYZ directions and gimbals for adjusting the plane of the bond head. A millimeter scale bonder interface 670 mates with a back side of μPnB assembly head substrate 407, for example through a precisely flattened vacuum block 660 that includes a plurality of gas passages 665 for pressure/vacuum control between bonder interface 670 and μPnB assembly head substrate 407. Microtools 380 then provide a working surface while μPnB assembly head substrate 407 is affixed to bonder 655. In exemplary embodiments described further below, each microtool 380 includes a pedestal to contact micro die coupled to a flexural member that is to conform to imperfectly flat source and target bonding substrates.

The μPnB assembly tool 601 may be built up by operating any known pick-n-place/compression die bonder to first pick up μPnB assembly head 401. The μPnB assembly head 401 is to be successively placed on a bonding source substrate and a bonding target substrate to transfer a plurality of micro die between the source and target substrates with each iteration. When μPnB assembly head 401 is placed on the bonding source substrate, microtools on head 401 temporary bond with the source die (e.g., with PSA material) to defeat the source substrate anchoring. When bonder 655 (re)places the μPnB assembly head 401 onto the bonding target substrate, the permanent bond formed between the die and target defeat the temporary bond with the μPnB assembly head 401. Then bonder 655 (re)places the μPnB assembly head 401 onto the bonding source substrate for another μPnB iteration. In the event μPnB assembly head 401 becomes aged, (e.g., after one or more placements between bonding source and target substrates), bonder 655 drops the aged μPnB assembly head 401 between micro die μPnB iterations and picks up a replacement μPnB assembly head 401 from a μPnB head tray. In this manner, μPnB assembly head 401 interacts with compression bonder 655 much like any millimeter-scale die. However, once picked up by bonder 655, the μPnB assembly head 401 serves as further tooling enabling compression bonder 655 to perform a μPnB assembly method (e.g., μPnB assembly method 101).

FIG. 6B further illustrates a μPnB assembly head fabrication method 602 by which microtools including a pedestal coupled to a flexural member are monolithically fabricated on a μPnB assembly head substrate. A head substrate received at operation 605 may be any substrate suitable for MEMS fabrication, such as, but not limited to, glass, silicon, germanium, SiGe, III-V compounds like GaAs, InP, III-N compounds like GaN, 3C—SiC, and sapphire to name a few. In one advantageous embodiment further illustrated in FIG. 7A, a head substrate 407 comprises glass or crystalline silicon having a site flatness of less than 0.1 μm for an 8×25 mm site. In the exemplary embodiment, head substrate flatness is further enhanced through thermal surface oxidation of a silicon substrate that forms a stoichiometric silicon dioxide ($SiO_2$) layer 718 disposed a head substrate 407.

Referring again to FIG. 6B, μPnB assembly head fabrication method 602 continues at operation 610 where a dielectric base layer is deposited over a low stress material layer disposed on the head substrate. While the exemplary embodiment illustrates both a dielectric base layer and low stress layer, in alternative embodiments (e.g., where a PSA material layer is thick enough to provide sufficient compliance) these underlayment layers are absent with subsequent material layers (e.g., PSA) deposited directly on the substrate. Both the low stress material and overlying dielectric base layer may be deposited as part of method 602, or an incoming substrate received at operation 605 may include either/both material(s). The low stress material layer(s) may be of any composition suitable for forming a flexural member having a controlled spring constant using any known MEMS/IC fabrication technique. In one exemplary embodiment, the low stress material is an Al/Cu alloy film of approximately 1 μm in thickness. The low stress material layer may be annealed as needed. In another exemplary embodiment, the low stress material is a silicon device layer of an SOI substrate. The dielectric base layer deposited over the low stress material layer(s) is advantageously a material that can be deposited to a thickness of 1-5 μm, is stable at high temperature (e.g., over 250° C.), and is amenable to patterning. In advantageous embodiments the dielectric base layer material is an organic polymer that can be spin-coated onto the head substrate and then cured and/or dried. One exemplary organic polymer is polyimide (PI).

At operation 615, PSA material is deposited over the substrate (e.g., over the head assembly material stack). The PSA material may be any known material that has a peel force suitable for the application (e.g., <1 N/cm). In further embodiments where the PSA material is to withstand high temperature die bonding, the PSA material is also stable at high temperatures. For example, the PSA material may be silicone-based (e.g., a siloxane polymer), as described above. In advantageous embodiments the PSA material is applied by spin-coating a silicone-based polymer mixture onto the head substrate and then curing and/or drying the mixture into the PSA material layer.

Figure 7A:
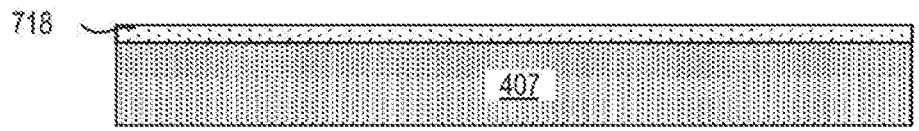
FIG. 7A, 7B, 7C, 7D, 7E, 7F, 7G are cross-sectional views of an exemplary µPnB head as selected operations from the method illustrated in FIG. 6B are performed, in accordance with embodiments.
Figure 7B:
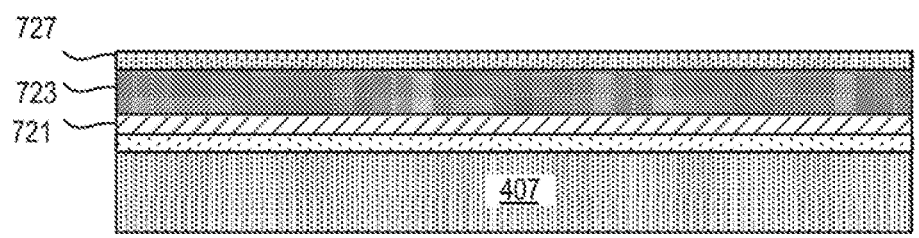
Figure 7C:
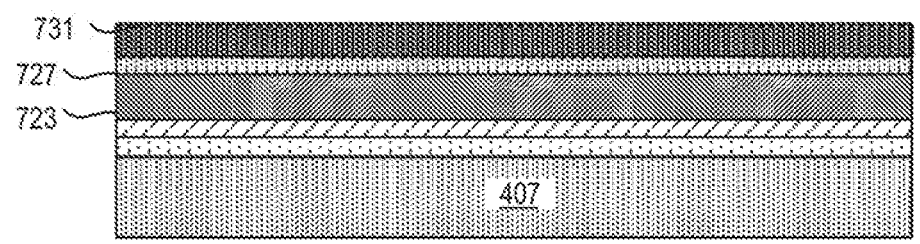

FIG. 7B further illustrates a head substrate following operation 610 where a low stress material layer 721 (e.g., AlCu) is deposited over stoichiometric $SiO_2$ layer 718 on a silicon substrate 407. A high temperature compatible dielectric base layer 723 is disposed on low stress material layer 721 and a capping layer 727 is deposited over dielectric base layer 723. Although optional, capping layer 727 may advantageously separate dielectric base layer 723 from the overlying PSA layer 731 (FIG. 7C). Depending on the composition of dielectric base layer 723 and PSA material layer 731, an intervening material, such as but not limited to SiON, may improve adhesion and/or facilitate patterning of the PSA layer 731 and/or dielectric base layer 723. In an embodiment where PSA is placed on LED instead of the μPnB head, material for layer 727 may be selected to fine tune adhesive and peeling forces. In advantageous embodiments, the material for layer 727 can be chosen to enable optical metrology for detecting the plane of the pedestals fabricated out of the dielectric base layer 723. For example, a metallic layer 727 can serve as a mirror, or a dielectric layer of different optical index from the adjacent layers 723 and 731 can enhance reflection for better signal.

Figure 7D:
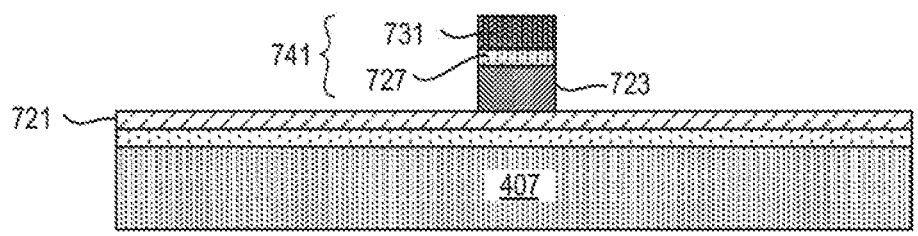

Returning to FIG. 6B, μPnB head fabrication method 602 continues at operation 620 where a plurality of μPnB head pedestals are patterned into the head assembly by etching through at least the PSA layer and further through the underlying dielectric material layer (when present) to expose the low stress layer (when present). FIG. 7D illustrates a pedestal 741 disposed on low stress layer 721. Pedestal 741 may be dimensioned and spaced apart from other pedestals (not depicted) according to specifications of the target bonding substrate. For example, in embodiments where pedestal 741 is to pick up a μLED having a 1-5 μm lateral dimension, pedestal 741 has a lateral dimension (e.g., y-dimension) also of 1-5 μm. In one advantageous embodiment, pedestal 741 has a circular footprint with a diameter of approximately 3 μm. To pattern pedestal 741, a photoresist may be spin coated over the material layer 731. In some embodiments, a thin oxide layer (not depicted) is disposed over the PSA material layer 731 to facilitate resist processing incompatible with the PSA material. The PSA material may be removed by either dry etch or solvent. In certain polyimide embodiments, the dielectric base layer 723 is photo-definable polyimide. A positive tone photo-definable PI may be lithographically patterned with the same mask and the same exposure employed to pattern the PSA material. In certain polyimide embodiments (e.g., non-photo-definable PI), the patterning may entail performing any known dry etch after removal of capping layer 727 and PSA layer 731.

Although in the exemplary embodiment depicted, PSA material layer 731 has substantially the same lateral dimensions as dielectric base layer 723 (i.e., nearly vertical pedestal sidewalls), in alternative embodiments pedestal 741 may be thick (e.g., 5 μm instead of 1 μm) and patterned to have positively sloped sidewalls with the PSA material layer 731 having a smaller lateral dimension than that of the dielectric base layer 723 to improve pedestal compliance. In still other embodiments, dielectric base material 723 has a bi-layer structure and a first layer of the bi-layer dielectric base material is undercut laterally relative to the second layer of the dielectric base material. For example a bottom layer of the bi-layer base material may be undercut by an amount equal to at least 10%-30% of the lateral width of the second layer of the bi-layer dielectric. An example of pedestal undercut is illustrated with dashed line in FIG. 7E. Undercutting the pedestal to reduce an area of the interface between the dielectric base layer and the flexural member to less than an exposed surface area of the PSA material may advantageously provide additional stress relief within the pedestal. Such stress reduction may ensure the pedestal is stable on a released flexural member and will maintain sufficient flatness across the plurality of head pedestals to make good contact with source/target bonding substrates. Pedestal undercut may also improve pedestal compliance. Pedestals may be undercut before or after patterning of the low stress layer into a flexural member.

Returning to FIG. 6B, μPnB assembly head fabrication method 602 continues at operation 630 where the low stress layer (if present) is patterned into a plurality of flexural members, each flexural member physically coupled to at least one pedestal. Together, the flexural member and the pedestal form the microtool 380 (FIG. 4A, 6A). The flexural members are to elastically deform/deflect relative to the assembly head substrate during μPnB assembly operations. The flexural members provide compliance or travel to the pedestals sufficient to accommodate a threshold level of flatness in the source bonding substrate and/or target bonding substrate so that contact can be made between each pedestal and the device and/or landing pad on source/target substrate. In exemplary embodiments, each flexural member is elastically deformable by at least 0.1 μm in a direction perpendicular to the substrate surface. Each flexural member may be fabricated with lateral dimensions that compliment the low stress material film thickness to achieve a desired spring constant and a strength sufficient to survive die pick up, bonding, and head separation. In exemplary embodiments where the PSA material has a peel strength of no more than 1.0 N/cm, each flexural member is dimensioned to have a spring constant of 100-600 N/m. The flexural member is dimensioned to support the pedestal. In other words the pedestal base completely floats on the flexural member, being coupled to the assembly head substrate only via the flexural member.

Figure 7E:
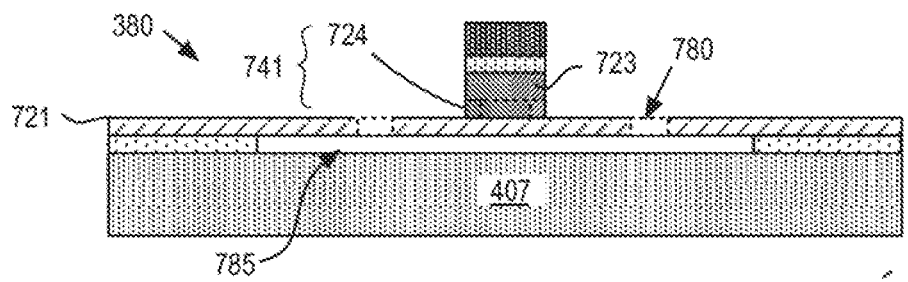
Figure 7F:
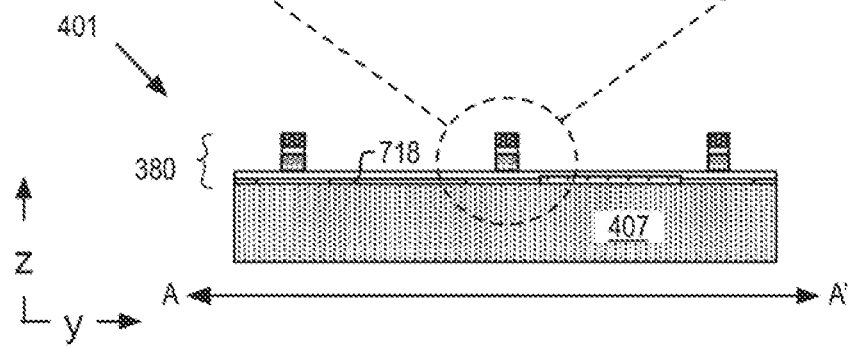
Figure 7G:
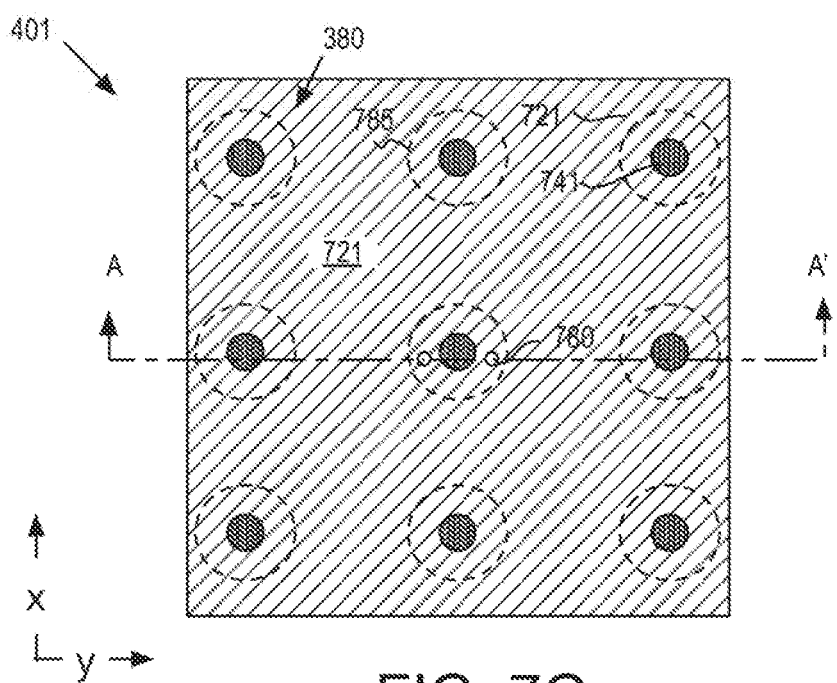

In an embodiment, fabrication of each flexural member at operation 630 entails etching a portion of the low stress layer and etching a recess in the substrate that undercuts the flexural member below the pedestal. The flexural member then extends over the recess allowing deflection of the flexural member in a direction perpendicular to the substrate surface. FIGS. 7E and 7F illustrate an exemplary microtool 380 after delineation and release of the flexural member. FIG. 7G illustrates a plan view of a plurality of microtools 380. As shown in FIG. 7E, release openings 780 are formed in low stress layer 721. A recess or void 785 is formed below pedestal 741. Low stress layer 721 then forms a membrane or diaphragm, which supports pedestal 741 over recess 785. As further illustrated in FIG. 7G, the low stress layer 721 is patterned into discrete membranes. In an advantageous embodiment, low stress layer 721 and layer 718 may be continuous over the μPnB assembly head with only the recess 785 discretely defined around each pedestal 741. By not removing layers 721 and 718, the topography of the substrate 407 is reduced, making it easier for metrology and used as the reference surface for mechanical stops 333 (FIG. 5A). Although circular flexural members are illustrated in the exemplary embodiment, flexural members may take other forms where the pedestal is still coupled to a region of the flexural member between two anchoring points that contact the substrate surface. In alternative embodiments, the pedestal may be coupled to the substrate through a flexural member having only one anchor point (e.g., cantilevered) or having two discrete anchor points (e.g., a bridge).

Figure 8A:
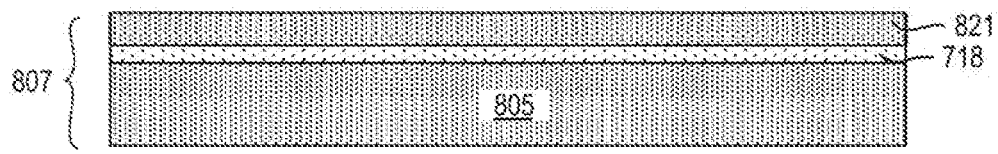
FIGS. 8A, 8B, 8C, and 8D are cross-sectional views of an exemplary µPnB head as selected fabrication operations are performed, in accordance with alternate embodiments.
Figure 8B:
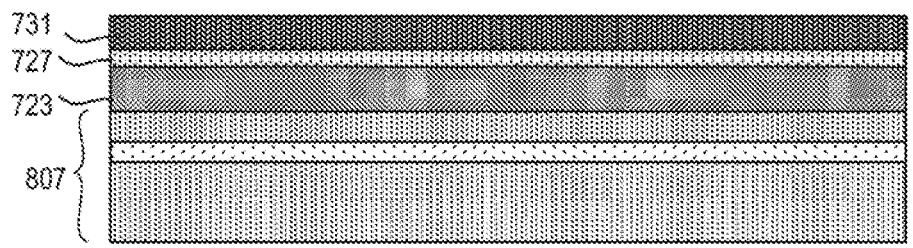
Figure 8C:
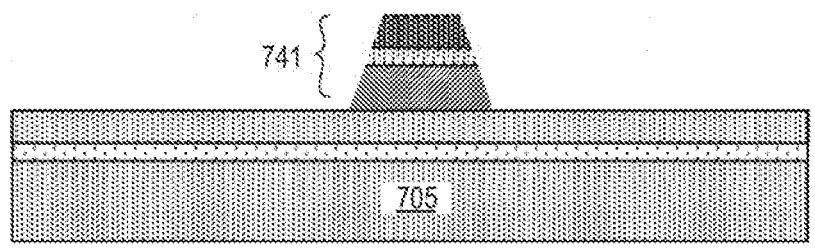
Figure 8D:
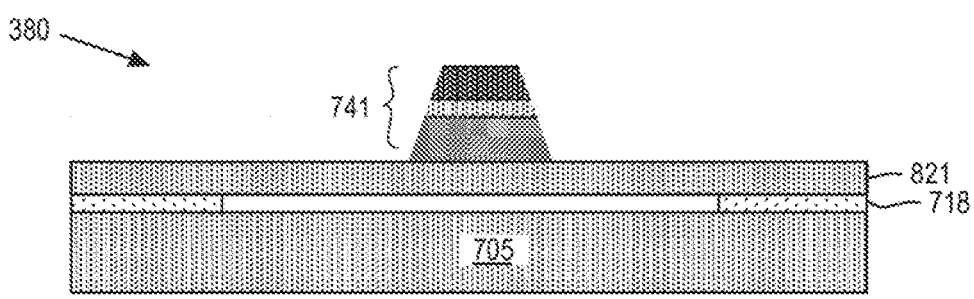

FIGS. 8A, 8B, 8C, and 8D are cross-sectional views of an exemplary μPnB head as selected fabrication operations from method 602 (FIG. 6B) are performed, in accordance with alternate embodiments. FIG. 8A illustrates an exemplary silicon-on-insulator (SOI) substrate 807 received as a starting material. SOI substrate 807 includes a (mono) crystalline silicon device layer 821 separated from a (mono) crystalline silicon substrate base 805 by a dielectric layer 718 (e.g., SiO$_2$). A pedestal material film, or film stack, is deposited over SOI substrate 807 substantially as described above. In the exemplary embodiment, dielectric base material 731 is a photosensitive PI. Barrier layer 727 (e.g., TiN) is deposited over dielectric base material 723, and PSA material 731 is deposited over dielectric barrier layer 727. A photoresist mask is formed over the pedestal material film stack. In an advantageous embodiment, a thin dielectric layer, (e.g., SiO$_x$) can be deposited on PSA 731 prior to photoresist deposition. The inter layer can eliminate chemical incompatibility between the resist and PSA, enhance resist adhesion, and can also serve as a hardmask for subsequent patterning. The SiOx interlayer can be easily removed during the undercut etch of the buried oxide 718. Unmasked PSA material 731 and barrier layer 727 is removed, and a flood exposure of the dielectric base material 731 completes patterning of the pedestal 741.

Following the patterning, many polyimide materials require high temperature curing. In some embodiments, where the curing temperature may be too high for PSA 731, PI is instead cured prior to depositing layers 727 and 731. The cured PI may then be dry etched after the removal of layers 727 and 731 instead of the flood exposure described above. In the exemplary embodiment illustrated in FIG. 8C, the dielectric base layer and/or the PSA is printed with a positive sidewall slope. In such embodiments, the pedestal base has a larger lateral dimension than the PSA material at the top surface of the pedestal to improve mechanical stability. As further illustrated in FIG. 8D, a portion of device layer 821 disposed below pedestal 741 is etched to open holes for undercut etch of the dielectric layer 718 and released from base substrate 705 to form a flexural member. Microtool 380 is then substantially complete and the monolithic assembly head substrate including a plurality of monolithic microtools 380 is ready for singulation and pick up.

As noted above, in some embodiments, a sufficiently thick PSA layer 731 alone provides adequate compliance for sufficiently planar source and target substrates and complexities associated with the flexural member may be avoided. For such embodiments, the microtool 380 includes just the pedestal 741 without any underlying flexural member. In certain such embodiments, substrate 805 may be a regular crystalline silicon wafer without the device layer 821 and the intervening dielectric layer 718.

In embodiments, the μPnB source substrate includes a PSA material. PSA material may be incorporated into the source substrate in addition to, or in the alternative to, incorporation of PSA material into a μPnB assembly head. FIG. 9 is a flow illustrating a method 901 for fabricating a μPnB source substrate including crystalline LED elements suitable for assembly into a display. FIG. 10A-10K provide cross-sectional views of exemplary crystalline LED elements as operations of the method 901 are performed, in accordance with embodiments. The same techniques may be directly applied to any micro device/die (e.g., any micron dimensioned IC or photonic chip, etc.).

Method 901 entails wafer-level processing suitable for generating the LED source substrate from a semiconductor LED film stack received at operation 905. The semiconductor LED film stack may be a contiguous film covering an epitaxial substrate to form a monolithic body (e.g., an LED epi wafer). Generally, any known semiconductor LED film stack may be utilized. In the exemplary embodiment illustrated in FIG. 10A, epi wafer 1001 includes an epitaxial substrate 1005, a buffer layer 1006 and semiconductor LED film stack 207 epitaxially grown on buffer layer 1006. In embodiments, LED film stack 207 includes one or more semiconductor heterojunction, for example forming a quantum well, etc., as described above in the context of FIG. 2A.

Epitaxial substrate 1005 may be any know substrate suitable for growing an LED semiconductor film stack. For example, substrate 1005 may be a variety of materials, including, but not limited to, silicon, germanium, SiGe, III-V compounds like GaAs, InP, III-N compounds like GaN, 3C—SiC, and sapphire to name a few. Buffer layer(s) 1006 may be of any known architecture suitable for transitioning from the composition/microstructure of epitaxial substrate 1005 to that of LED film stack 207.

Returning to FIG. 9, method 901 continues with operation 910 where an electrode metal is deposited over the LED film stack. The composition of electrode metal may vary as a function of the LED film stack, for example to provide a desired metal work function suitable for providing an ohmic contact, tunneling contact, etc. In one exemplary embodiment, the metal deposited at operation 910 is a p-type metal suitable for making contact to p-type doped semiconductor layer of an LED film stack. Any known deposition technique, such as but not limited to PVD, CVD, electrolytic, or electroless plating may be utilized at operation 910. As further illustrated in FIG. 10B, a p-type metal film 210 is blanket deposited over a p-type doped semiconductor layer of an LED film stack 207.

Returning to FIG. 9, method 901 continues with operation 915 where the LED film and metal electrode stack is coupled to a carrier. At operation 920, the LED and metal electrode stack is decoupled from the LED epi substrate. Operations 915 and 920 implement a wafer-level thin film transfer allowing the LED film stack to be sandwiched between two opposing metal electrodes. At operation 915, any technique known in the art may be utilized to couple the LED film and electrode stack to a carrier. In one embodiment, LED film and electrode stack to a carrier are coupled with any (thermal) compression bonding technique. In an alternative embodiment, the LED film/electrode stack and carrier are electrostatically and/or adhesively coupled. In one such embodiment further illustrated in FIG. 10C, bonding material layer 1012 is a second PSA material (e.g., a high-temp compatible silicone-based PSA). The bonding material layer 1012 is applied over at least one of the metal electrode 210 or carrier 220. The bonding material layer 1012 is then compressed between carrier 220 and the device material stack. Compression may be at room temperature for an adhesive bond, or at elevated temperature for an inorganic (e.g., $SiO_x$) bond. In advantageous adhesive bonding embodiments, an electrostatic clamping force applied by an electrostatic carrier may compress the adhesive material. Use of an electrostatic carrier may ensure sufficient flatness during subsequent removal of the epitaxial substrate. Following removal of the epitaxial substrate, the clamping voltage may be discharged in reliance on the adhesive material bond. Any known electrostatic carrier, such as a glass carrier with embedded electrodes may be utilized. Any technique known in the art may be utilized to decouple the LED film/metal electrode stack from the epitaxial substrate to arrive at the structure illustrated in FIG. 10D. For example, a laser liftoff or CMP/grind and clean may be utilized to remove the epitaxial substrate to expose a second doped semiconductor region (e.g., n-type doped layer) of the LED film stack 207.

Returning to FIG. 9, method 901 continues at operation 925 where a second metal electrode film is deposited over the surface of the LED film stack exposed by operation 920. The composition of the second electrode metal may vary as a function of the LED film stack, for example to provide a desired metal work function suitable for providing an ohmic contact, tunneling contact, etc. In one exemplary embodiment, the metal deposited at operation 925 is an n-type metal suitable for making contact to n-type doped semiconductor layer of an LED film stack. Any known deposition technique, such as but not limited to PVD, CVD, electrolytic, or electroless plating may be utilized at operation 925. As further illustrated in FIG. 10E, n-type metal film 225 is blanket deposited over an n-type doped semiconductor layer of an LED film stack 207.

Figure 10A:
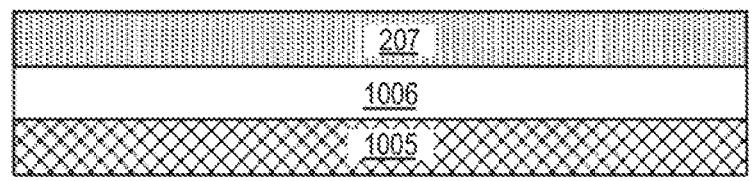
FIGS. 10A, 10B, 10C, and 10D, 10E, 10F, 10G, 10H, 10I, 10J, and 10K are cross-sectional views of exemplary crystalline LED elements as illustrative operations of the method in FIG. 9 are performed, in accordance with embodiments.
Figure 10B:
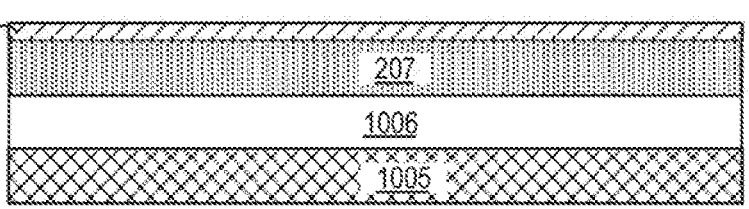
Figure 10C:
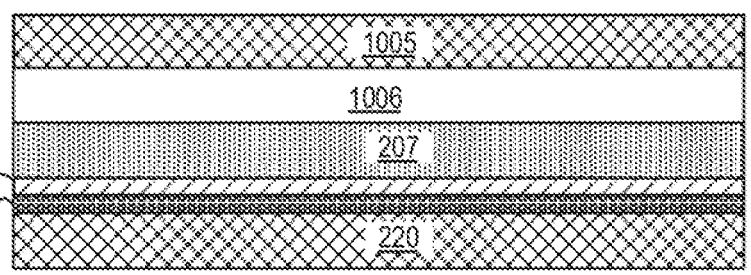
Figure 10D:
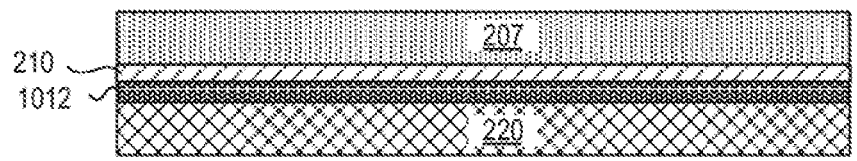
Figure 10E:
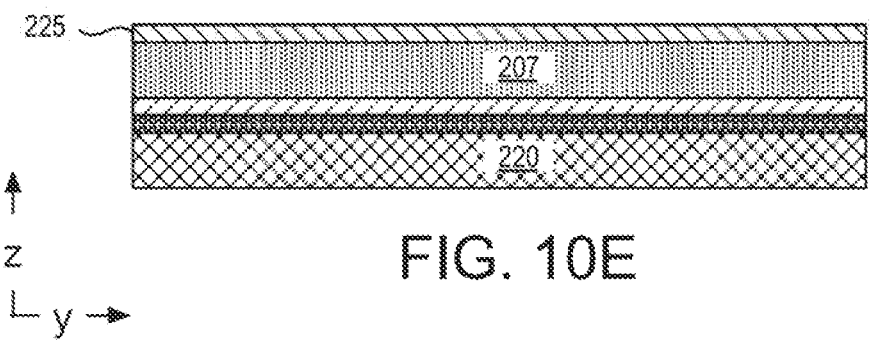
Figure 10F:
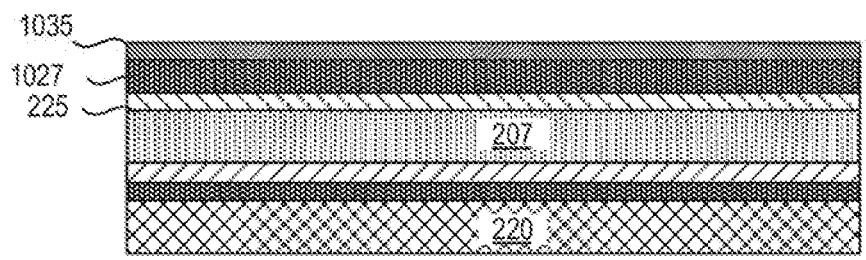

Returning to FIG. 9, method 901 continues at operation 930 where PSA material is deposited over the second metal electrode film. A protective capping material may be further deposited over the PSA material layer. The PSA material may be any of those described above, such as, but not limited to high temperature compatible silicone-based PSA. In the exemplary embodiment a liquid mixture including siloxane polymer (or precursors thereof) is applied over the second metal electrode film using any spin-on process. The PSA mixture is then cured and/or dried to form the PSA material layer. In certain embodiments, the PSA material layer is deposited to a thickness of 1-5 μm. The capping material is optional, but advantageously enables subsequent photolithography and protects the PSA material from erosion during subsequent processing. The capping material may be of any material known in the art to be suitable for the purpose. Any low temperature deposition technique, such as but not limited to PVD and CVD may be utilized to deposit the capping material over the PSA material. FIG. 10F further illustrates a PSA material 1027 blanket deposited over the n-type metal LED electrode film 225, and a carbon doped silicon nitride (CDN) film 1035 blanket deposited over PSA material 1027.

Returning to FIG. 9, method 109 continues at operation 935 where a plurality of LED elements is formed by etching trenches into the LED semiconductor film stack. Any known photolithographic mask patterning and thin film etching process may be utilized at operation 935. The dimensions of the mask features at operation 935 substantially set the dimensions of the LED elements that will be incorporated into a display. The PSA material may be etched with a dry or wet chemical process. A wet chemical etch will produce an isotropic etch profile that reduces the aspect ratio of the trenches between LED elements as a function of the PSA material thickness, which is advantageous where a greater thickness of PSA material (e.g., 2 μm-5 μm) is employed for increased pedestal compliance.

At operation 940, a dielectric sidewall spacer is formed over the LED element sidewalls. Any known dielectric material, such as but not limited to amorphous Si or carbon, $SiO_x$, SiON, SiN, CDO, and CDN may be conformally deposited over the LED elements. An anisotropic etch is then performed using any anisotropic etch process known in the art to be suitable for the chosen dielectric material to form an at least partially self-aligned sidewall coating over the metal and semiconductor sidewalls of each LED element.

Figure 10G:
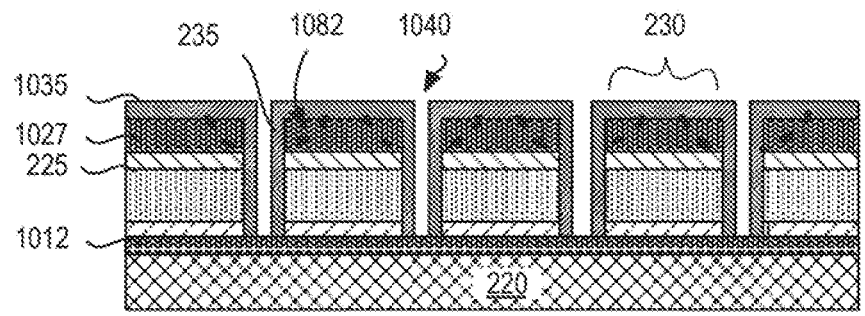
Figure 10H:
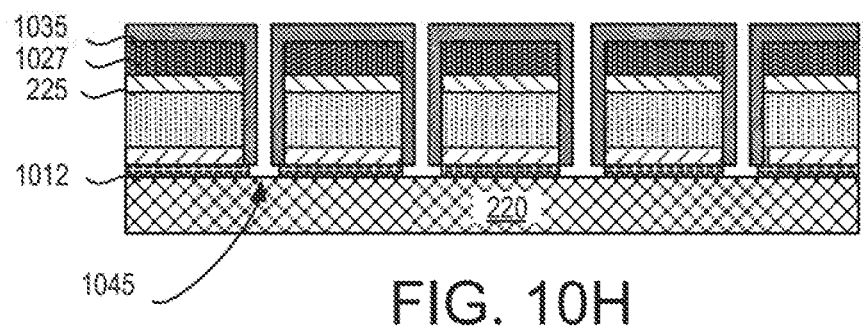
Figure 10I:
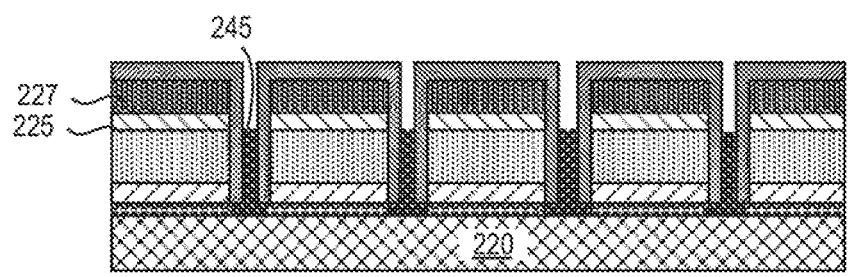
Figure 10J:
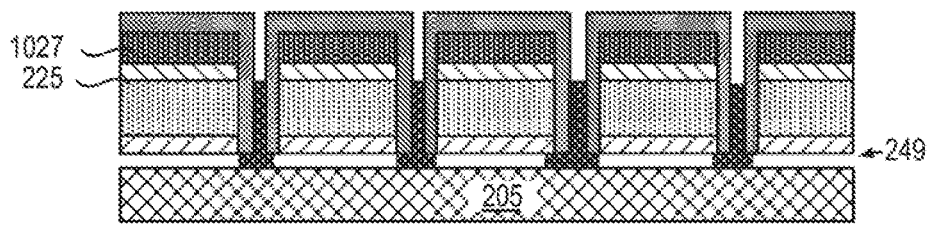

FIG. 10G is a cross-sectional view of crystalline LED elements 230 following their delineation and encapsulation by dielectric spacer. A wet-etched profile 1082 is illustrated in dashed line with the capping layer 1035 removed and spacer 235 covering only the LED element sidewall. In one such embodiment, since a capping layer does not protect PSA 1082, the bonding layer 1012 is advantageously of a different composition than PSA 1082. For example, the bonding layer 1012 can be another PSA of alternate composition that is removable by a solvent having selectivity over PSA 1082. Alternatively bonding layer 1012 may be $SiO_x$, which can be removed with HF. In exemplary embodiments, the lateral element width $W_e$ of each LED element 230 is patterned to be no more than 5 μm. As further depicted, spacer dielectric 235 (e.g., CDN) serves as a self-aligned sidewall dielectric coating on the LED elements 230. In embodiments including capping layer 1035, LED elements 230 may be encapsulated on five of six sides by one or more dielectric material (e.g., CDN). In advantageous embodiments, the thickness of the dielectric material utilized for spacer formation is selected to ensure dielectric spacer 235 has a lateral thickness, or width $W_s$ that is less than half the nominal lateral width $W_t$ of the trenches 1040 etched into the LED film stack. The limitation on spacer width ensures two dielectric spacers on adjacent LED elements leave a portion of substrate material (e.g., bonding/release material 1012) exposed at the bottom of trench 1040.

Bonding material 1012 may then be removed to release the LED elements except for selected anchor points, or if the bonding material is a PSA material, the LED elements may be removed from the source substrate simply by overcoming the bonding material coupling the elements to the carrier. For example the PSA material coupling the elements to the carrier may be selected to have a lower peel strength and/or lower shear strength relative to the PSA material on a topside of the LED elements at operation 930 (FIG. 9). For example, a low temperature PSA material may be utilized at for bonding material layer 1012 (FIG. 10G), while a high temperature compatible PSA material is utilized for PSA material layer 1027. Upon exposure of PSA material 1027 and contact with a heated assembly head pedestal, a local heating of the contacted LED elements may enable a bond of the PSA material layer 1027 to overcome the bond of bonding material layer 1012. In another embodiment, the bonding layer 1012 may be removed from the perimeter of LED elements 230 to leave only a central contacting area sufficiently small for the LED to be picked up via PSA 1027.

Alternatively, LED element anchors may be patterned within the trenches between adjacent elements and the bonding material layer 1012 removed around the anchor. For such an embodiment, the bonding material layer 1012 may be an adhesive or otherwise (SiO$_x$). As further illustrated in FIG. 10H, at least a portion of one or more of bonding material layer 1012 is recessed. In such an embodiment, the material layer 1012 is functionally both a bonding and a release layer. Bonding material layer 1012 may be recessed below dielectric spacer 235 with a blanket etch process masked by dielectric spacer 235 and capping material 1035 protecting PSA material 1027. Anchor material is then deposited into the recessed trenches between adjacent LED elements 230, filling at least the recessed release layer and a portion of the trench lined by the dielectric spacer. Anchor material may be back filled into the trenches, planarizing with a top surface of LED elements 230, for example with a spin-on process. The planarized anchor material may then be patterned into a plurality of separate anchors 245, as further illustrated in FIG. 10I. In one advantageous embodiment, the anchor material is a photosensitive polymeric material (e.g., photoresist) spin-coated into the trenches. The photoresist is then lithographically patterned (i.e., exposed and developed) into separate LED element anchors 245 filling the trench and maintaining separation between adjacent LED elements 230. With the anchors in place, the LED elements are otherwise released from the carrier at operation 950. For example, as further illustrated in FIG. 10J, bonding material 1012 is laterally etched, for example with any isotropic dry or wet chemical etchant, undercutting the plurality of crystalline LED elements 230 and forming void 249 surrounding anchors 245.

Figure 10K:
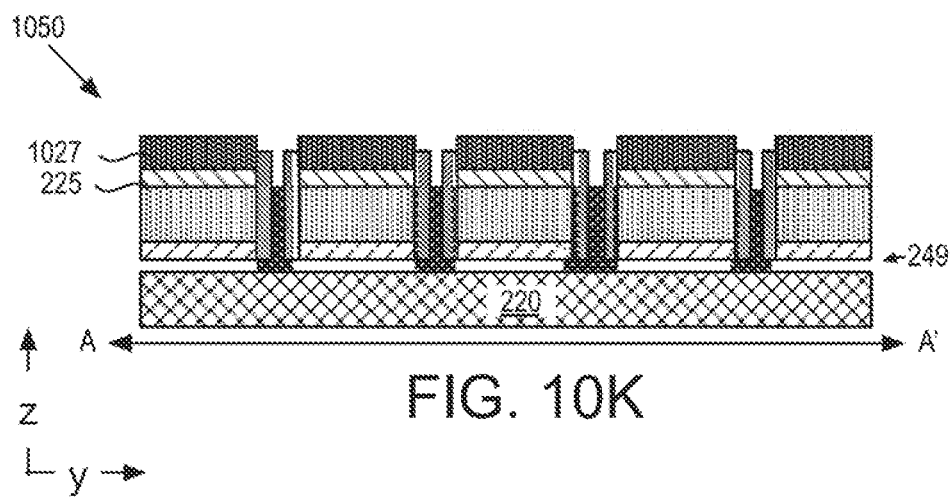
Figure 10L:
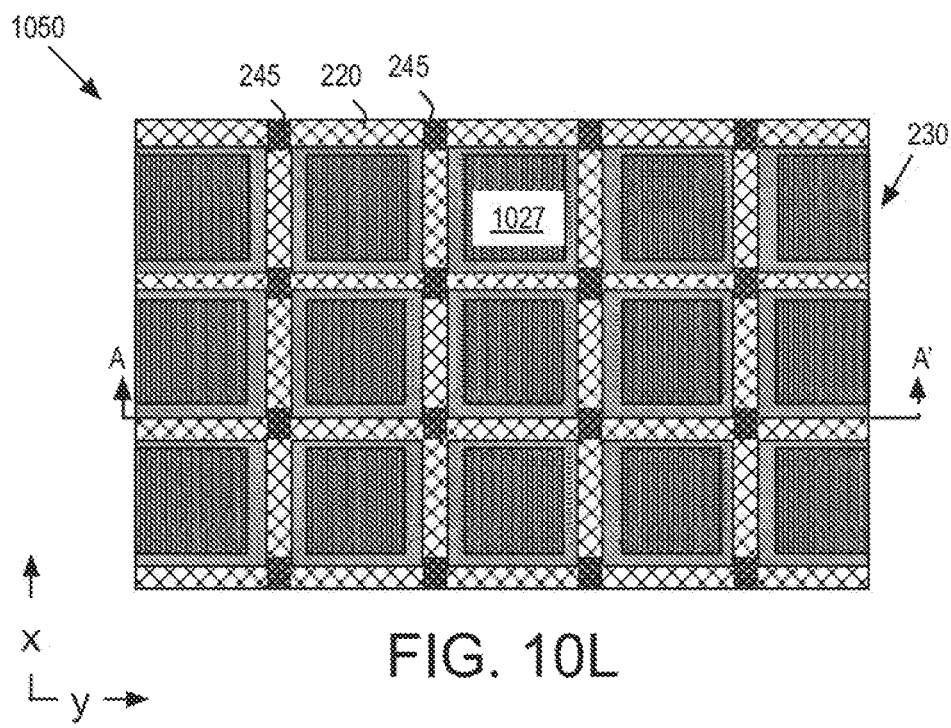
FIG. 10L is a plan view of the crystalline LED elements depicted in FIG. 10K, in accordance with embodiments.

Anchors 245 landing on carrier 220 are then surrounded by a free-space void 249 extending over the entire lateral area or footprint of each LED element 230. In the exemplary embodiments where a photosensitive polymer is employed for the anchor material, each anchor 245 is a polymer pillar contacting the sidewall dielectric (spacer 235) coating at least two adjacent LED elements 230 (e.g., four nearest LED elements 230 are connected by each anchor 245 located at corners of elements 230, or two nearest LED elements are connected if anchors 245 are located at edges instead of the corners). Capping material 1035 is then removed to expose PSA material 1027. Source substrate 1050 illustrated in FIGS. 10K and 10L is then ready for transfer/bonding to a target substrate in substantially the same manner as described above for source substrate 201A that lacks PSA material 1027. In further embodiments therefore, method 901 may be modified to forgo the application of PSA material 1027 in reliance of the assembly head providing an alternate means (e.g., PSA material) for micro die pick up.

Figure 11:
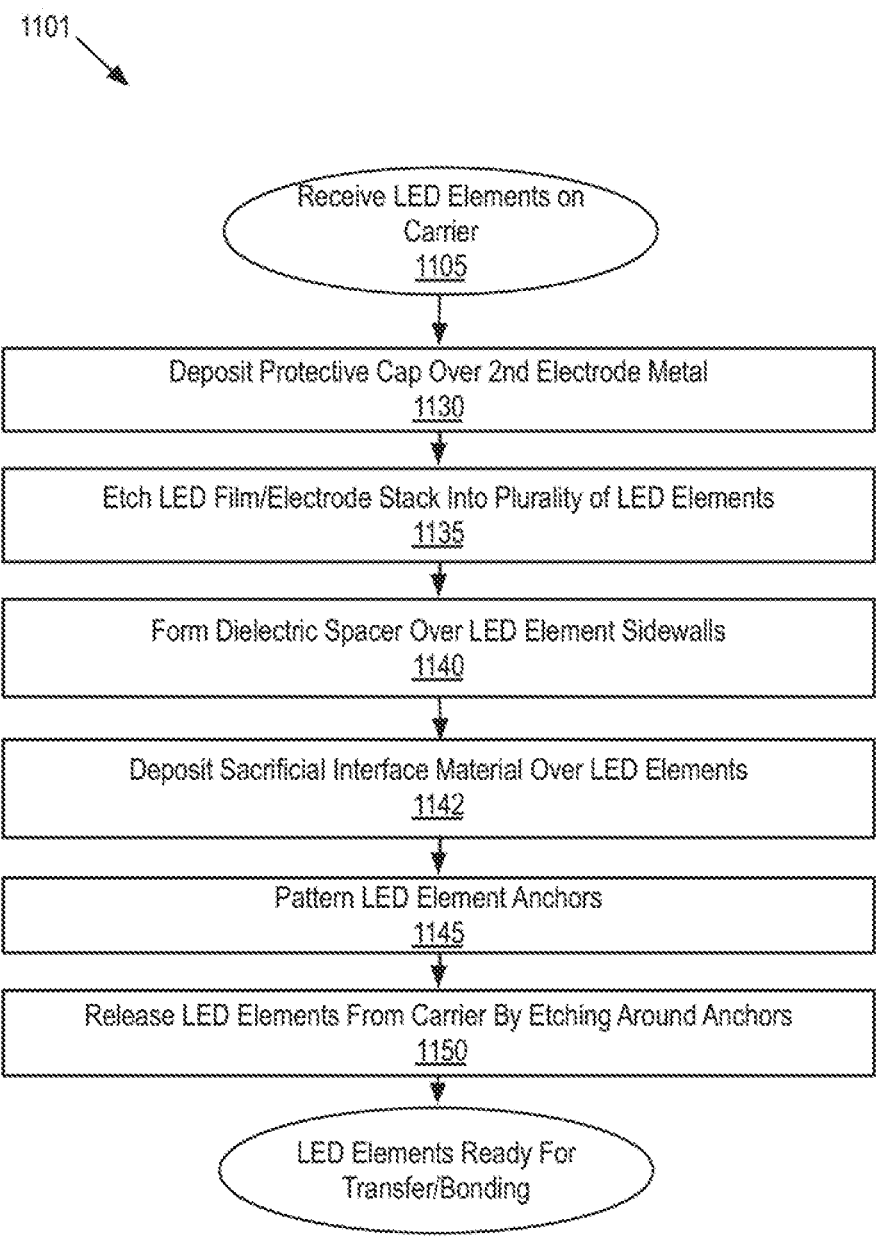
FIG. 11 is a flow illustrating a method of fabricating a µPnB source substrate including crystalline LED elements suitable for assembly into a display, in accordance with alternative embodiments.
Figure 12A:
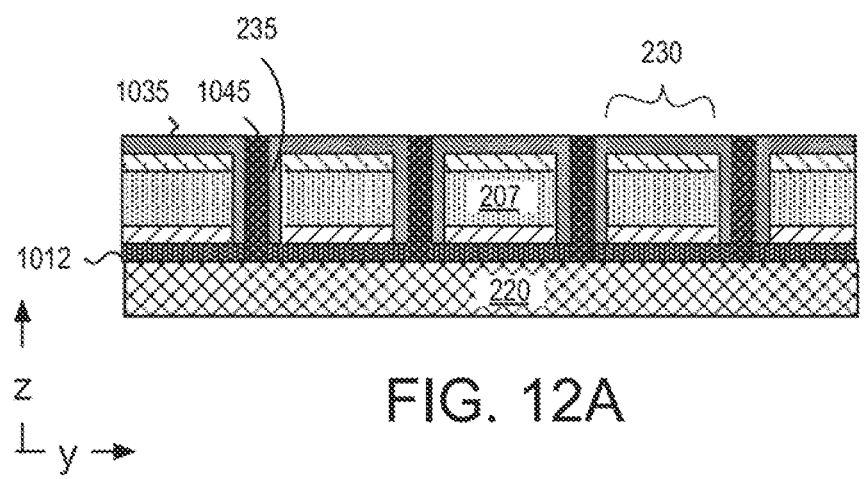
FIGS. 12A, 12B, and 12C are cross-sectional views of exemplary crystalline LED elements as illustrative operations of the method in FIG. 11 are performed, in accordance with alternative embodiments.
Figure 12B:
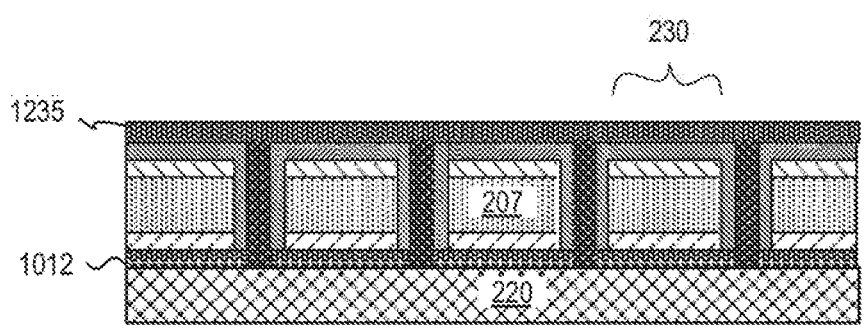
Figure 12C:
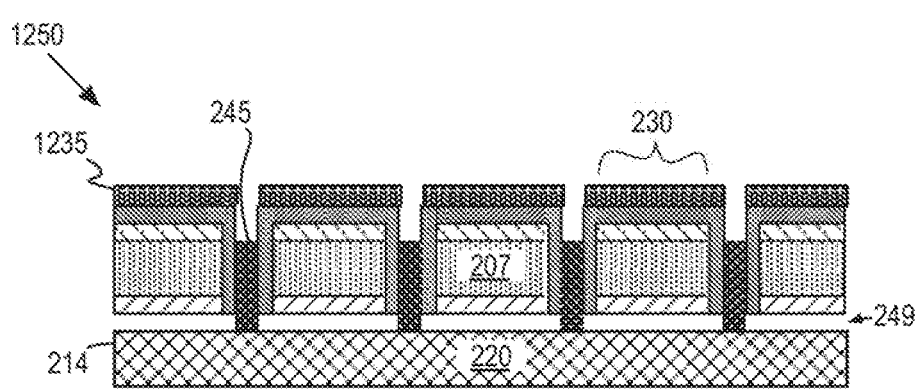

FIG. 11 is a flow illustrating a method 1101 for fabricating a μPnB source substrate including crystalline LED elements suitable for assembly into a display, in accordance with alternative embodiments where a sacrificial layer is incorporated into the source substrate to facilitate separating micro die from the assembly head after bonding to a target substrate. Generally, a sacrificial layer may be incorporated into the source substrate in addition to a PSA material or in the alternative to incorporation of a PSA material into the source substrate. FIG. 12A-12C are cross-sectional views of exemplary crystalline LED elements as illustrative operations of the method 1101 are performed in accordance with one exemplary embodiment.

Method 1101 begins with receiving a plurality of monolithically integrated LED elements disposed over a carrier substrate at operation 1105. In the exemplary embodiment, the LED elements have been fabricated on an epitaxial substrate and transferred to the carrier substrate substantially as described above in the context of operations 905-920 (FIG. 9). Method 1101 continues with depositing dielectric capping layer at operation 1130, etching the LED film/electrode stack into a plurality of LED elements at operation 1135, and forming dielectric spacer over the LED element sidewalls at operation 1140, substantially as described above in the context of method 901. In the exemplary embodiment further illustrated in FIG. 12A, anchor material 1045 is planar with dielectric capping material 1035. Method 1101 continues at operation 1142 where a sacrificial interface material is deposited over the LED elements. In exemplary embodiments, the sacrificial interface material is thermally decomposable. The decomposition temperature is advantageously 250° C., or more. In one exemplary embodiment illustrated in FIG. 12B, a sacrificial interface material 1235, such as polycarbonate, is spun over the planarized LED elements, and cured at a relatively low temperature (e.g., below 150° C.). At operation 1145, sacrificial interface material 1235 is lithographically patterned along with the anchor photoresist. As shown in FIG. 12C, once the planarized photoresist is exposed and developed to form anchors, the LED elements are otherwise released from the carrier by removing bonding material 1012 to form void 249 substantially as described above. Dielectric spacer 235, and sacrificial interface material 1235 protects the LED film stack (capping material 1035 may be eliminated). Source substrate 1250 illustrated in FIG. 12C is then ready for pickup/bonding to a target substrate. After a thermal bonding operation (e.g., operation 130 in FIG. 1) with properly selected materials (e.g., InAu), the bond head can be heated up to a higher temperature so that sacrificial interface material 1235 decomposes to release the head assembly from the source die. Capping dielectric 1035 may then be removed after all LED elements are assembled on the target substrate to expose the LED film stack and/or top electrode.

Figure 13:
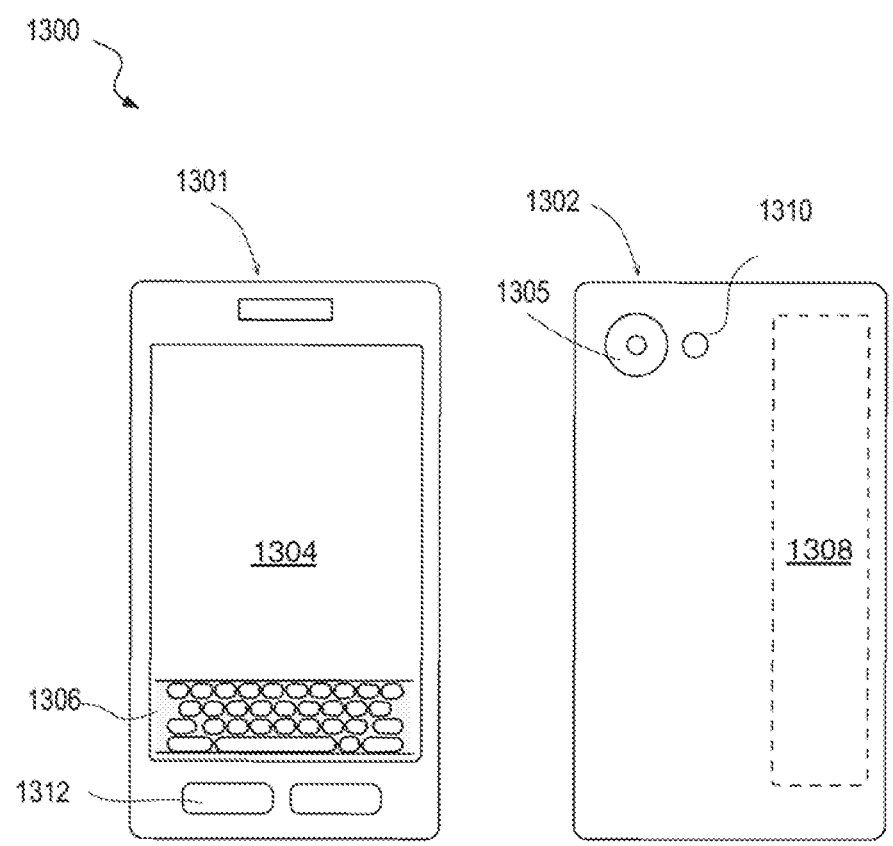
FIG. 13 illustrates front and back views of a mobile computing device incorporating a crystalline LED display in accordance with embodiments.

LED displays assembled in accordance with embodiments herein may be incorporated into an electronic device embodied in varying physical styles or form factors. FIG. 13 illustrates front and back views of a mobile computing handset device 1300 incorporating a crystalline LED display in accordance with embodiments. In embodiments, for example, device 1300 may be implemented as a mobile computing device having wireless capabilities. A mobile computing device may refer to any device having a processing system and a mobile power source or supply, such as one or more batteries, for example. Examples of a mobile computing device may include an ultra-laptop computer, tablet, touch pad, portable computer, handheld computer, palmtop computer, personal digital assistant (PDA), cellular telephone, combination cellular telephone/PDA, television, smart device (e.g., smartphone, tablet or smart television), mobile internet device (MID), messaging device, data communication device, and so forth. Examples of a mobile computing device also may include computers and/or media capture/transmission devices configured to be worn by a person, such as a wrist computer, finger computer, ring computer, eyeglass computer, belt-clip computer, arm-band computer, shoe computers, clothing computers, and other wearable computers. In various embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 13, mobile handset device 1300 may include a housing with a front 1301 and back 1302. Device 1300 includes a crystalline LED display assembly 1304, for example in accordance with exemplary embodiments described above. Device 1300 further includes an input/output (I/O) device 1306, and an integrated antenna 1308. Device 1300 also may include navigation features 1312. I/O device 1306 may include any suitable I/O device for entering information into a mobile computing device. Examples for I/O device 1306 may include an alphanumeric keyboard, a numeric keypad, a touch pad, input keys, buttons, switches, microphones, speakers, voice recognition device and software, and so forth. Information also may be entered into device 1300 by way of microphone (not shown), or may be digitized by a voice recognition device. Embodiments are not limited in this context. Integrated into at least the back 1302 is camera 1305 (e.g., including a lens, an aperture, and an imaging sensor), and a flash 1310, both of which may be components of a camera module to originate image data processed by device 1300 into streaming video that is to be displayed on crystalline LED display assembly 1304 and/or transmitted remotely off the device 1300.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the inventive scope is not limited to the embodiments so described, but can be practiced with modification and alteration without departing from the scope of the appended claims. For example the above embodiments may include specific combinations of features as further provided below.

In one or more first embodiment, a micro-pick-and-bond (µPnB) assembly head comprises a substrate, a plurality of pedestals. Each pedestal comprises a base mechanically coupled to the substrate and a pressure sensitive adhesive (PSA) material at a tip opposite the substrate.

In furtherance of the first embodiment, the assembly head further comprising a plurality of flexural members arrayed over the substrate, each pedestal coupled to the substrate through one or more of the flexural members.

In furtherance of the first embodiment, the base comprises a dielectric material disposed between the PSA material and the flexural member.

In furtherance of the first embodiment, a largest lateral dimension of the pedestal base is less than 10 µm, and a height of the pedestal from the flexural member is less than 10 µm.

In furtherance of the first embodiment, the PSA material has sloped sidewalls with the PSA having lateral dimensions proximal to the tip being smaller than those proximal to the substrate, and/or the base comprises a dielectric material disposed between the PSA material and the substrate and a portion of the dielectric base material is undercut with the area the dielectric base layer proximal to the substrate being less than the area of an exposed surface the adhesive material.

In furtherance of the first embodiment, the PSA material is a silicone-based PSA material; and the pedestal base comprises a polymeric dielectric material.

In furtherance of the first embodiment, the PSA material is stable to at least 160° C.

In furtherance of the embodiment immediately above, the PSA material is stable to at least 250° C., and comprises a siloxane polymer.

In furtherance of the embodiment, each flexural member is elastically deformable by at least 0.1 µm in a direction perpendicular to the substrate surface.

In furtherance of the embodiment immediately above, each flexural member has a spring constant of 100-600 N/m, and the PSA material has a peel strength of no more than 1.0 N/cm.

In furtherance of the embodiment above, each flexural member extends over a recess in the substrate surface, and the pedestal is coupled to a region of the flexural member between anchoring points that contact the substrate surface.

In furtherance of the embodiment immediately above, the flexural member comprises at least one metal thin film or semiconductor thin film anchored to the substrate by a dielectric thin film material.

In furtherance of the first embodiment, the substrate comprises glass or crystalline silicon having a site flatness of less than 1 µm for an 8×25 mm site, and the flexural member comprises a crystalline silicon layer of the substrate or a metal thin film separated from the substrate by a stoichiometric $SiO_2$ layer.

In furtherance of the first embodiment, the pedestal has a circular top surface with a diameter less than 5 µm.

In one or more second embodiment, a crystalline LED display, comprises a display interface including a plurality of metal interconnects, and a plurality of LED elements. Each of the plurality of LED elements include a first metal electrode coupled to at least one of the metal interconnects, and at least one of the plurality of LED elements further includes a pressure sensitive adhesive (PSA) over a surface of the LED element opposite the first metal electrode.

In furtherance of the first embodiment, the PSA comprises a siloxane polymer, and the metal interconnect is coupled to the first electrode by solder or conductive adhesive.

In one or more third embodiment, a method of fabricating a micro-pick-and-bond (µPnB) assembly head include depositing a pressure sensitive adhesive (PSA) material layer over a substrate, and patterning the PSA material layer into a plurality of pedestals arrayed over the substrate.

In furtherance of the third embodiment, the method further includes depositing a dielectric base layer over a low stress material layer disposed on a substrate. The method comprises depositing a pressure sensitive adhesive (PSA) material layer over the dielectric base layer. The method comprises patterning the PSA material layer and the dielectric base layer into a plurality of pedestals. The method comprises patterning the low stress material layer into a plurality of flexural members, each flexural member structurally supporting at least one of the pedestals. The method comprises forming a recess in the substrate that undercuts the flexural member below the pedestal.

In furtherance of the third embodiment, depositing the dielectric base layer further comprises spin coating a mixture including a high temperature stable polymer over the low stress material and curing or drying the mixture into the dielectric base layer. Depositing the PSA material layer further comprises spin coating a liquid mixture including a siloxane polymer and curing or drying the mixture into the PSA material layer. Patterning the PSA material layer and the dielectric base layer into a plurality of pedestals further comprises depositing and patterning a photoresist over the PSA material layer, and etching or dissolving portions of the PSA material layer and dielectric base layer unprotected by the patterned photoresist.

In furtherance of the third embodiment, the method further comprises depositing an inorganic dielectric material between the dielectric base layer and the pressure sensitive adhesive (PSA) material and patterning the inorganic dielectric material along with the PSA material and the dielectric base layer to form the pedestals. The method further comprises reducing an area of the interface between the dielectric base layer and the flexural member to less than an exposed surface area of the PSA material by undercutting the dielectric base layer.

In one or more fourth embodiment, a micro-pick-and-bond (µPnB) assembly method, comprises aligning a plurality of µPnB head pedestals with a plurality of die anchored to a source substrate. The method comprises pressing each the plurality of die with a surface of at least one of the µPnB head pedestals to adhere a die to a pedestal with a pressure sensitive adhesive (PSA) material. The method comprises breaking anchors between the die and the source substrate by displacing the µPnB head pedestals relative to the source substrate while the die are adhered to the pedestals with the PSA material. The method comprises aligning the plurality of die affixed to the µPnB head pedestals with lands on a bonding target substrate. The method comprises affixing the plurality of die to the lands on the bonding target substrate. The method comprises breaking the PSA bond between the die and the pedestals while the die are affixed to the lands.

In furtherance of the embodiment immediately above, breaking the PSA bond between the die and the pedestals further comprises at least one of displacing the µPnB head pedestals relative to the target substrate, or thermally decomposing a thermally decomposable material interfacing the PSA material.

In furtherance of the embodiment immediately above, breaking the PSA bond between the die and the pedestals further comprises displacing the µPnB head pedestals in both lateral and vertical directions concurrently to peel the PSA material from an interface material of either the pedestal or the die.

In furtherance of the fourth embodiment, affixing the plurality of die to the lands on the bonding target substrate further comprises solder bonding the die.

In one or more fifth embodiment, a micro-pick-and-bond (µPnB) source substrate comprises a carrier, and a plurality of device elements disposed over the carrier. Each device element further comprises a device material stack, an electrode between the device material stack and the carrier, and at least one of a pressure sensitive adhesive (PSA) material or a thermally decomposable material separated from the electrode by at least the device material stack.

In furtherance of the fifth embodiment, the plurality of device elements comprises a plurality of LED elements. Each LED element further comprises a semiconductor LED film stack including at least first and second doped semiconductor regions disposed between a first metal LED electrode and a second metal LED electrode, the first metal LED electrode facing the carrier and spaced apart from the carrier by a free-space void. Each LED element further comprises a sidewall dielectric coating disposed over sidewalls of the LED film stack, the first metal LED electrode, and the second metal LED electrode. The source substrate further comprises a plurality of anchors disposed within trenches separating each LED element from adjacent LED elements.

In furtherance of the fifth embodiment, the plurality of device elements comprises a plurality of LED elements. Each LED element further comprises an epitaxial semiconductor LED film stack including at least first and second doped semiconductor regions, a first metal LED electrode in contact with the first doped semiconductor region, a dielectric sidewall spacer around the first metal LED electrode and a sidewall of the first doped semiconductor region, and a second metal LED electrode further comprising a metal spacer adjacent to the dielectric spacer and in electrical contact with the second doped semiconductor region. The source substrate further comprises a plurality of anchors disposed within trenches separating each LED element from adjacent LED elements.

In one or more sixth embodiment, a method of forming a micro-pick-and-bond (µPnB) source substrate comprises monolithically fabricating a plurality of microelectronic or photonic devices on a substrate. The method comprises applying a pressure sensitive adhesive (PSA) over the monolithic microelectronic or photonic devices. The method comprises patterning trenches through the PSA and between the microelectronic or photonic devices to define individual die. The method comprises releasing the individual die from the substrate by etching one or more material surrounding one or more anchor coupled to each die.

In furtherance of the sixth embodiment, monolithically fabricating the plurality of microelectronic or photonic devices on the substrate further comprises forming a device material stack over a first substrate, performing a substrate-level transfer of the device material stack from the first substrate to a carrier substrate, and applying the PSA over the device material stack while affixed to the carrier substrate.

In furtherance of the embodiment immediately above, performing the substrate-level transfer further comprises applying a second PSA material to at least one of the carrier and the surface of the device material stack, compressing the second PSA material between carrier and the device material stack, and removing the first substrate to expose the device material stack. Releasing the individual die from the substrate by etching one or more material surrounding one or more anchor coupled to each die further comprises dissolving the second PSA material between the carrier and the device material stack.

In furtherance of the embodiment immediately above, the carrier comprises and electrostatic carrier with one or more electrostatic clamping structure. Compressing the PSA material between carrier and the device material stack comprises applying a voltage to the electrostatic carrier to develop an electric field across the PSA material.

In furtherance of the sixth embodiment, monolithically fabricating the plurality of microelectronic or photonic devices on the substrate further comprises depositing a first metal electrode film over a semiconductor LED film stack covering an epitaxial substrate. Monolithically fabricating the plurality of microelectronic or photonic devices on the substrate further comprises transferring the LED film and electrode stack to a carrier, the first metal electrode film facing the carrier. Monolithically fabricating the plurality of microelectronic or photonic devices on the substrate further comprises depositing a second metal electrode film over the LED film stack. Monolithically fabricating the plurality of microelectronic or photonic devices on the substrate further comprises forming a plurality of LED elements by etching trenches into the LED film stack, first metal electrode film, and the second metal electrode film, each LED element having sidewalls defined by the trench etching. Monolithically fabricating the plurality of microelectronic or photonic devices on the substrate further comprises forming dielectric spacer over LED element sidewalls. Monolithically fabricating the plurality of microelectronic or photonic devices on the substrate further comprises forming LED element anchors within the trenches, the anchors intersecting portions of the LED element sidewalls. Monolithically fabricating the plurality of microelectronic or photonic devices on the substrate further comprises releasing the LED elements from the carrier except for the anchors by laterally etching a release layer between the LED element and the carrier.

In one or more seventh embodiment, a micro-pick-and-bond (µPnB) target substrate comprises a plurality of die lands arrayed over the target substrate, each die land further comprising solder or an adhesive, and at least one mechanical stand-off adjacent to at least one of the die lands, the standoff having a z-height greater than a z-height of the die land added to a z-height of a die to be affixed to the land.

In furtherance of the seventh embodiment, the standoff comprises photoresist.

In furtherance of the seventh embodiment, each die land comprises an optically transmissive adhesive or a conductive adhesive.

However, the embodiments are not limited to the examples above, and in various implementations the above embodiments may include the undertaking only a subset of such features, undertaking a different order of such features, undertaking a different combination of such features, and/or undertaking additional features than those features explicitly listed. The inventive scope should, therefore, be determined with reference to the appended claims, along with the full scope of equivalents to which such claims are entitled.

What is claimed is:

1. A LED display, comprising:
   a display interface including a plurality of metal interconnects; and
   a plurality of LED elements, each comprising crystalline semiconductor, wherein:
      each of the plurality of LED elements includes:
         a first electrode coupled to a first of the metal interconnects;
         a LED material stack including at least first and second doped semiconductor regions over the first electrode; and
         a sidewall dielectric in direct physical contact with, and encircling, an outer perimeter sidewall of at least the LED material stack; and
      each the plurality of LED elements further includes a pressure sensitive adhesive (PSA) over at least a portion of a top surface of the LED element opposite the first electrode, the PSA having an outer perimeter sidewall also encircled by, and in direct physical contact with, the sidewall dielectric.

2. The LED display of claim 1, wherein the PSA comprises at least Si and oxygen.

3. The LED display of claim 2, wherein the PSA comprises a siloxane polymer.

4. The LED display of claim 1, wherein the first of the metal interconnects is coupled to the first electrode by solder or conductive adhesive.

5. The LED display of claim 4, wherein the first of the metal interconnects is coupled to the first electrode by conductive adhesive, and wherein the conductive adhesive comprises polyaniline.

6. The LED display of claim 5, wherein the conductive adhesive has a resistivity of not more than 1 ohm-cm.

7. The LED display of claim 4, wherein the display interface comprises a display backplane and the first of the metal interconnects couples the first electrode with one or more of display driving circuitry, access transistors, or discrete electronics.

8. The LED display of claim 7, wherein each of the plurality of LED elements has a dimension no more than 5×5 µm, wherein the first of the metal interconnects comprises a metal pad with a lateral dimension no larger than 10 µm and having a pitch with a second of the metal interconnects that is not over 25 µm.

9. The LED display of claim 1, further comprising:
   at least one mechanical stand-off adjacent to at least one of the LED elements, the standoff having a z-height greater than a z-height of one of the LED elements summed with a z-height of a die land to which the one of the LED elements is affixed.

10. The LED display of claim 1, wherein a top surface of the PSA is above a height of the sidewall dielectric.

11. The LED display of claim 1, wherein the PSA is in direct contact with at least a portion of a second electrode coupled to the LED material stack.

12. A LED display, comprising:
   a display interface including a plurality of metal interconnects; and
   a plurality of LED elements, each comprising crystalline semiconductor, wherein:
      each of the plurality of LED elements includes a first electrode coupled to a first of the metal interconnects through an optically transmissive adhesive;

a LED material stack including at least first and second doped semiconductor regions over the first electrode; and a sidewall dielectric in direct physical contact with, and encircling, an outer perimeter sidewall of at least the LED material stack; and each of the plurality of LED elements further includes a pressure sensitive adhesive (PSA) over at least a portion of a top surface of the LED element opposite the first electrode, the PSA having an outer perimeter sidewall also encircled by, and in direct physical contact with, the sidewall dielectric.

13. The LED display of claim 12, wherein each of the LED elements is to emit light through the optically transmissive adhesive.

14. The LED display of claim 13, wherein the metal interconnects are between individual ones of the LED elements and a display cover.

15. The LED display of claim 14, wherein display cover comprises glass or sapphire.

16. The LED display of claim 12, wherein the PSA comprises at least Si and oxygen.

17. The LED display of claim 16, wherein the PSA comprises a siloxane polymer.

* * * * *